(12) United States Patent
Ueda

(10) Patent No.: US 7,482,641 B2
(45) Date of Patent: Jan. 27, 2009

(54) WHITE LIGHT EMITTING ELEMENT AND WHITE LIGHT SOURCE

(75) Inventor: Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/060,278

(22) Filed: Feb. 18, 2005

(65) Prior Publication Data
US 2005/0184298 A1    Aug. 25, 2005

(30) Foreign Application Priority Data
Feb. 19, 2004    (JP)  ............................. 2004-043561

(51) Int. Cl.
H01L 33/00    (2006.01)
(52) U.S. Cl. ........................... 257/100; 257/79; 257/98
(58) Field of Classification Search .................. 257/79, 257/98, 100
See application file for complete search history.

(56) References Cited

U.S. PATENT DOCUMENTS

| | | | |
|---|---|---|---|
| 5,289,081 A | | 2/1994 | Tamatani et al. |
| 6,310,364 B1 | | 10/2001 | Uemura |
| 6,600,175 B1 | * | 7/2003 | Baretz et al. ................. 257/100 |
| 7,268,370 B2 | | 9/2007 | Ueda |
| 2002/0003233 A1 | | 1/2002 | Mueller-Mach et al. |
| 2002/0030197 A1 | | 3/2002 | Sugawara et al. |
| 2003/0155856 A1 | * | 8/2003 | Shiiki et al. .................. 313/483 |
| 2004/0041220 A1 | * | 3/2004 | Kwak et al. .................. 257/432 |
| 2004/0106222 A1 | * | 6/2004 | Steckl et al. ................... 438/22 |
| 2005/0051790 A1 | | 3/2005 | Ueda |
| 2007/0057269 A1 | | 3/2007 | Ueda |

FOREIGN PATENT DOCUMENTS

| | | |
|---|---|---|
| JP | 9-232627 | 2/1997 |
| JP | 09036430 | 7/1997 |
| JP | 10-261818 | 9/1998 |
| JP | 2000-091703 | 3/2000 |
| JP | 2000-183408 | 6/2000 |
| JP | 2000-261034 | 9/2000 |
| JP | 2001-007401 | 1/2001 |
| JP | 2001-257379 | 9/2001 |
| JP | 2001-352098 | 12/2001 |

(Continued)

OTHER PUBLICATIONS

English Language Abstract of JP 2002-246651, published Aug. 30, 2002.

(Continued)

*Primary Examiner*—Long Pham
(74) *Attorney, Agent, or Firm*—Greenblum & Bernstein, P.L.C.

(57) ABSTRACT

A white light source has an excitation light source and a white light emitting element provided at a position which allows the transmission of light from the excitation light source to generate white light through irradiation with the light from the excitation light source. The white light emitting element has a sapphire substrate made of sapphire or the like which transmits visible light, an InGaAlN semiconductor layer formed on a surface of the sapphire substrate to emit red light through irradiation with visible light, and a fluorescent layer formed on the surface opposite to the surface provided with the semiconductor layer to emit yellow light or green light through irradiation with visible light.

21 Claims, 12 Drawing Sheets

FOREIGN PATENT DOCUMENTS

| | | |
|---|---|---|
| JP | 2002-042525 | 2/2002 |
| JP | 2002-057376 | 2/2002 |
| JP | 2002-246651 | 8/2002 |
| JP | 2002-368265 | 12/2002 |
| JP | 2003-037291 | 2/2003 |
| JP | 2003-055656 | 2/2003 |
| JP | 2003-60223 | 2/2003 |
| JP | 2003-152222 | 5/2003 |
| JP | 2003-197969 | 7/2003 |
| JP | 2004-228464 | 8/2004 |

OTHER PUBLICATIONS

English Language Abstract of JP 2001-257379, published Sep. 21, 2001.
English Language Abstract of JP 2003-60223, published Feb. 28, 2003.
English Language Abstract of JP 2002-057376.
English Language Abstract of JP 2000-183408.
English Language Abstract of JP 2004-228464.
English Language Abstract of JP 2001-007401.
English Language Abstract of JP 2001-352098.
English Language Abstract of JP 2003-152222.
Shuji Namura and Gerhard Fasol, "The Blue Laser Diode," Springer-Verlag, Berlin, Heidelberg, New York, p. 216, (Jan. 1997).
U.S. Appl. No. 11/060,425 to UEDA, filed Feb. 18, 2005.
English Language Abstract of JP 2000-261034, Published Sep. 22, 2002.
English Language Abstract of JP 9-232627, Published Feb. 26, 1997.
English language abstract JP 09036430.
Studenikin et al., "Fabrication of green and orange photoluminescent, undoped ZnO films using spray pyrolysis", Journal of Applied Physics vol. 84, No. 4 (Aug. 15, 1998) pp. 2287-2294.
English Language Abstract of JP 2003-197969.
English Language Abstract of JP 2003-055656.
English Language Abstract of JP 10-261818, (Sep. 1998).
English Language Abstract of JP 2002-368265.
English Language Abstract of JP 2003-037291.
English Language Abstract of JP 2002-042525.
English Language Abstract of JP 2000-091703.

* cited by examiner

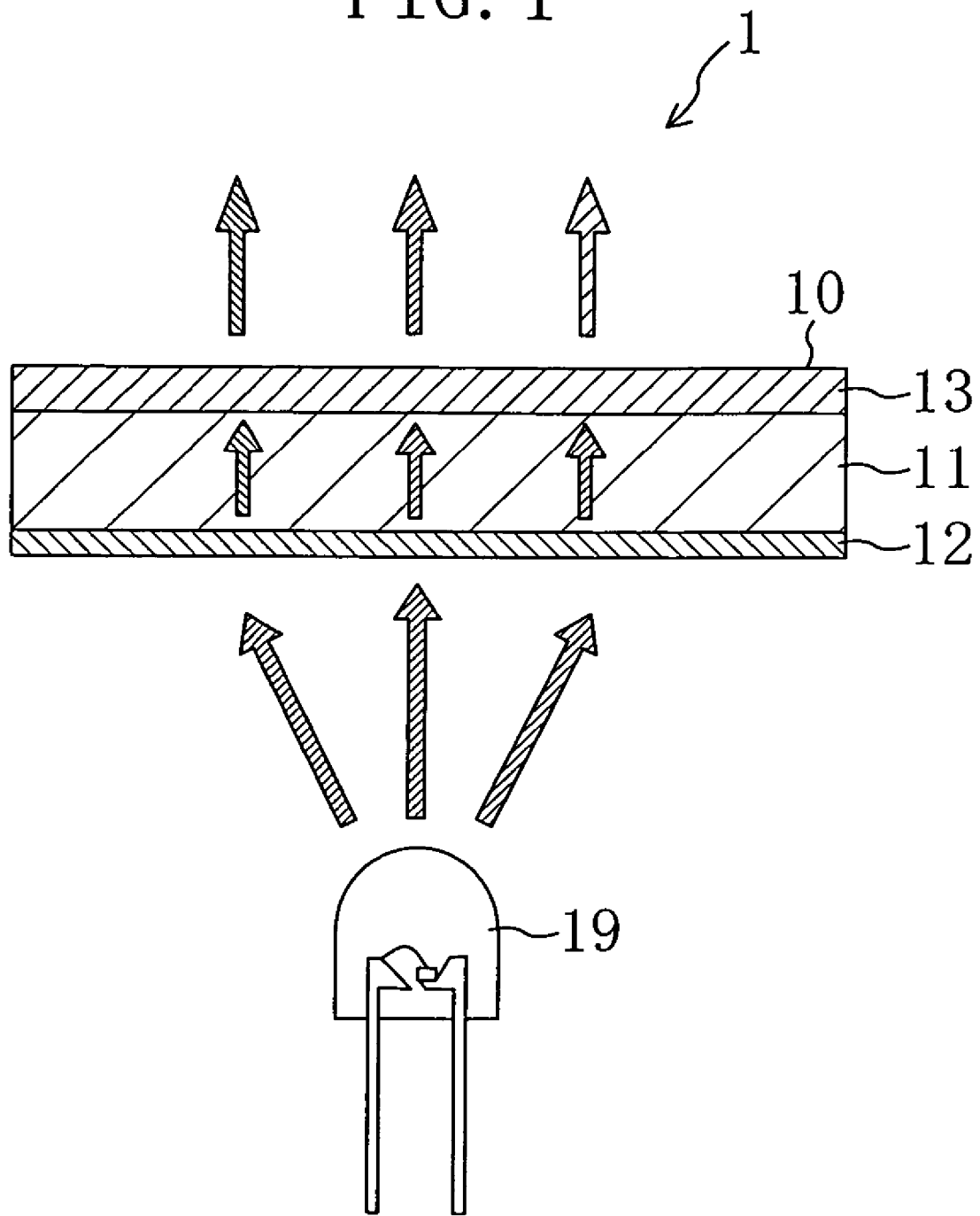

Position in White Light Element
(in Direction of Depth)

WHITE LIGHT EMITTING ELEMENT AND WHITE LIGHT SOURCE

CROSS-REFERENCE TO RELATED APPLICATIONS

This application claims priority under 35 U.S.C. §119 on patent application Ser. No. 2004-43561 filed in Japan on Feb. 19, 2004, the entire contents of which are hereby incorporated by reference. The entire contents of patent application Ser. No. 2005-040853 filed in Japan on Feb. 17, 2005 are also incorporated by reference.

BACKGROUND OF THE INVENTION

The present invention relates to a white light emitting element and a white light source comprising the white light emitting element which are applicable to, e.g., a white light emitting diode.

In a GaN-based III-V compound semiconductor (hereinafter referred to as "GaN-based semiconductor") represented by $Al_xGa_yIn_{(1-x-y)}N$ ($0 \leq x \leq 1$, $0 \leq y \leq 1$, $0 \leq 1-x-y<1$), the forbidden band width of GaN at a room temperature is 3.4 eV, which indicates that the GaN-based semiconductor is a material capable of implementing a high-output light emitting element which emits blue or green light. The GaN-based semiconductor has already been commercialized as a blue/green light emitting diode in various displays including a large-scale display and a traffic signal. Further, the use of the GaN-based semiconductor for the light emitting element of a white light source has also been examined.

If such a white light source can be realized, semiconductor illumination as a replacement for currently prevailing fluorescent and incandescent lamps can be implemented. Accordingly, vigorous research and development has been promoted with the aim of enhancing brightness and improving a light emitting efficiency. For example, a white light source in which a blue light emitting diode (hereinafter referred to as "GaN-based blue light emitting diode") using a nitride semiconductor as a light emitting element is used for an excitation light source and a YAG fluorescent material is used for a white light emitting element is disclosed in, e.g., S. Nakamura et al., "The Blue Laser Diode" Springer-Verlag Berlin Heidelberg New York. In the white light source, the YAG fluorescent material is irradiated with blue light (light with a peak wavelength of about 470 nm) from the blue light emitting diode so that a portion of the blue light is absorbed by the YAG fluorescent material. As a result, the YAG fluorescent material emits yellow light, while the remaining portion of the blue light passes through the YAG fluorescent material without being absorbed thereby. Thus, the irradiation of the YAG fluorescent material with blue light causes the emission of white light composed of blue light and yellow light, as is disclosed in the foregoing document. The white light source has already been commercialized and used for various displays and the like.

To use the white light source for illumination, however, the improvement of the manner in which the white light source used for illumination appears, i.e., a color rendering property is important in addition to the enhancement of brightness and the improvement of the light emitting efficiency. The emission spectrum of the white light source is composed only of yellow light and blue light and therefore the ratio of the red component to the other color components is low. As a result, the light emitted from the white light source has a poor color rendering property as white light.

SUMMARY OF THE INVENTION

In view of the technological problems described above, it is therefore an object of the present invention to provide a white light emitting element which emits white light featuring a high color rendering property and a white light source in which the white light emitting element and an excitation light source have been integrated.

A first white light emitting element according to the present invention is a white light emitting element for generating white light through irradiation with visible light, comprising: a substrate which transmits the visible light; a semiconductor layer formed on a surface of the substrate; and a fluorescent layer formed on a surface of the substrate opposite to the surface thereof provided with the semiconductor layer or on a surface of the semiconductor layer, wherein the fluorescent layer emits yellow light or green light through irradiation with the visible light and the semiconductor layer emits red light through irradiation with the visible light.

A second white light emitting element according to the present invention is a white light emitting element for generating white light through irradiation with ultraviolet light, comprising: a substrate which transmits the ultraviolet light; a semiconductor layer formed on a surface of the substrate; and a fluorescent layer formed on a surface of the substrate opposite to the surface thereof provided with the semiconductor layer or on a surface of the semiconductor layer, wherein the fluorescent layer emits yellow light or green light and blue light through irradiation with the ultraviolet light and the semiconductor layer emits red light through irradiation with the ultraviolet light.

In the second white light emitting element, the fluorescent layer preferably contains a plurality of fluorescent materials and the fluorescent materials preferably emit light in different colors through irradiation with the ultraviolet light.

In each of the first and second white light emitting elements, the fluorescent layer for emitting the yellow light or the green light may contain a YAG fluorescent material.

A third white light emitting element according to the present invention is a white light emitting element for generating white light through irradiation with ultraviolet light, comprising: a substrate which transmits the ultraviolet light; and a semiconductor layer formed on a surface of the substrate, wherein the semiconductor layer emits red light, yellow light or green light, and blue light through irradiation with the ultraviolet light.

Each of the first, second, and third white light emitting elements preferably emits white light composed of the red light, the yellow light or the green light, and the blue light through irradiation with the visible light or with the ultraviolet light.

A fourth white light emitting element according to the present invention is a white light emitting element for generating white light through irradiation with ultraviolet light or visible light, comprising: a substrate which transmits the ultraviolet light or the visible light; and a semiconductor layer formed on a surface of the substrate, wherein the semiconductor layer is composed of a plurality of compound semiconductor layers having different element composition ratios and each of the compound semiconductor layers is formed to have a forbidden band width the value of which monotonously increases or decreases in a direction from the surface of the substrate toward a surface of the semiconductor layer.

In the fourth white light emitting element, a lattice constant in a crystal structure of each of compound semiconductors composing the individual compound semiconductor layers preferably has a constant value.

In the fourth white light emitting element, light emitted from individual compound semiconductors preferably has different wavelengths due to the different element composition ratios of the individual compound semiconductors and the fourth white light emitting element preferably emits white light composed of the plurality of light components emitted from the individual compound semiconductors.

A fifth white light emitting element according to the present invention is a white light emitting element for generating white light through irradiation with ultraviolet light or visible light, comprising: a substrate which transmits the ultraviolet light or the visible light; and a semiconductor layer formed on a surface of the substrate, wherein the semiconductor layer is composed of compound semiconductors and element composition ratios of the compound semiconductors continuously vary in a direction from the surface of the substrate toward a surface of the semiconductor layer.

In the fifth white light emitting element, a lattice constant in a crystal structure of each of the compound semiconductors composing the semiconductor layer preferably has a constant value in the direction from the surface of the substrate toward the surface of the semiconductor layer.

In the fifth white light emitting element, light components emitted from the individual compound semiconductors preferably have different wavelengths due to the different element composition ratios of the compound semiconductors composing the semiconductor layer and the fifth white light emitting element preferably emits white light composed of the plurality of light components emitted from the individual compound semiconductors.

In each of the first, second, third, fourth, and fifth white light emitting elements, the semiconductor layer preferably contains impurities and the semiconductor layer preferably emits light in a visible region through recombination between an electron and a hole via an energy level resulting from the impurities through irradiation with the visible light or with the ultraviolet light. The semiconductor layer may contain any one or two or all of Si, Mg, and Zn each as an impurity.

In each of the first, second, third, fourth and fifth white light emitting elements, it is preferable that the semiconductor layer contains impurities and the semiconductor layer emits light in a visible region via inner shell transition of the impurity through irradiation with the visible light or the ultraviolet light. Further, the semiconductor layer may contain any one or two or all of Eu, Sm and Yb each as the impurity. Also, the impurity is preferable to be introduced to the semiconductor layer by ion implantation.

In each of the first, second, third, fourth, and fifth white light emitting elements, the semiconductor layer may be made of $Al_xGa_yIn_{(1-x-y)}N$ ($0 \leq x \leq 1$, $0 \leq y \leq 1$, $0 \leq 1-x-y \leq 1$).

In each of the first, second, third, fourth, and fifth white light emitting elements, the substrate which transmits the visible light or the ultraviolet light may be made of sapphire.

A first white light source according to the present invention is a white light source comprising: an excitation light source; and a white light emitting element for generating white light through irradiation with light from the excitation light source, wherein the excitation light source emits visible light, the white light emitting element comprises: a substrate which transmits the light from the excitation light source; a semiconductor layer formed on a surface of the substrate; and a fluorescent layer formed on a surface of the substrate opposite to the surface thereof provided with the semiconductor layer or on a surface of the semiconductor layer, the fluorescent layer emits yellow light or green light through irradiation with the visible light, and the semiconductor layer emits red light through irradiation with the visible light.

A second white light source according to the present invention is a white light source comprising: an excitation light source; and a white light emitting element for generating white light through irradiation with light from the excitation light source, wherein the excitation light source emits ultraviolet light, the white light emitting element comprises: a substrate which transmits the light from the excitation light source; a semiconductor layer formed on a surface of the substrate; and a fluorescent layer formed on a surface of the substrate opposite to the surface thereof provided with the semiconductor layer or on a surface of the semiconductor layer, the fluorescent layer emits yellow light or green light and blue light through irradiation with the ultraviolet light, and the semiconductor layer emits red light through irradiation with the ultraviolet light.

In the second white light source according to the present invention, the fluorescent layer preferably contains a plurality of fluorescent materials and the fluorescent materials preferably emit light in different colors through irradiation with the ultraviolet light.

In each of the first and second white light sources, the fluorescent layer for emitting the yellow light or the green light may contain a YAG fluorescent material.

A third white light source according to the present invention is a white light source comprising: an excitation light source; and a white light emitting element for generating white light through irradiation with light from the excitation light source, wherein the excitation light source emits ultraviolet light, the white light emitting element comprises: a substrate which transmits the light from the excitation light source; and a semiconductor layer formed on a surface of the substrate, and the semiconductor layer emits red light, yellow light or green light, and blue light through irradiation with the ultraviolet light.

The third white light source preferably emits white light composed of the red light, the yellow light or the green light, and the blue light through irradiation with the visible light or with the ultraviolet light.

A fourth white light source according to the present invention is a white light source comprising: an excitation light source; and a white light emitting element for generating white light through irradiation with light from the excitation light source, wherein the excitation light source emits ultraviolet light or visible light, the white light emitting element comprises: a substrate which transmits the light from the excitation light source; and a semiconductor layer formed on a surface of the substrate, the semiconductor layer is composed of a plurality of compound semiconductor layers having different element composition ratios, and each of the compound semiconductor layers is formed to have a forbidden band width the value of which monotonously increases or decreases in a direction from the surface of the substrate toward a surface of the semiconductor layer.

In the fourth white light source, a lattice constant in a crystal structure of each of compound semiconductors composing the individual compound semiconductor layers preferably has a constant value.

In the fourth white light source, light components emitted from individual compound semiconductors preferably have different wavelengths due to the different element composition ratios of the individual compound semiconductors and the fourth white light emitting element preferably emits white light composed of the plurality of light components emitted from the individual compound semiconductors.

A fifth white light source according to the present invention is a white light source comprising: an excitation light source; and a white light emitting element for generating white light through irradiation with light from the excitation light source, wherein the excitation light source emits ultraviolet light or visible light, the white light emitting element comprises: a substrate which transmits the light from the excitation light source; and a semiconductor layer formed on a surface of the substrate, the semiconductor layer is composed of compound semiconductors, and element composition ratios of the compound semiconductors continuously vary in a direction from the surface of the substrate toward a surface of the semiconductor layer.

In the fifth white light source, a lattice constant in a crystal structure of each of the compound semiconductors composing the semiconductor layer preferably has a constant value in the direction from the surface of the substrate toward the surface of the semiconductor layer.

In the fifth white light source, light components emitted from the individual compound semiconductors preferably have different wavelengths due to the different element composition ratios of the compound semiconductors composing the semiconductor layer and the fifth white light source preferably emits white light composed of the plurality of light components emitted from the individual compound semiconductors.

In each of the first, second, third, fourth, and fifth white light sources, the semiconductor layer preferably contains impurities and the semiconductor layer preferably emits light in a visible region through recombination between an electron and a hole via an energy level resulting from the impurities through irradiation with the visible light or with the ultraviolet light. The semiconductor layer may contain any one or two or all of Si, Mg, and Zn each as an impurity.

In each of the first, second, third, fourth and fifth white light sources, it is preferable that the semiconductor layer contains impurities and the semiconductor layer emits light in a visible region via inner shell transition of the impurities through irradiation with the visible light or the ultraviolet light. Further, the semiconductor layer may contain any one or two or all of Eu, Sm and Yb each as the impurity. Also, the impurity is preferable to be introduced to the semiconductor layer by ion implantation.

In each of the first, second, third, fourth, and fifth white light sources, the semiconductor layer may be made of $Al_x Ga_y In_{(1-x-y)}N$ ($0 \leq x \leq 1$, $0 \leq y \leq 1$, $0 \leq 1-x-y \leq 1$).

In each of the first, second, third, fourth, and fifth white light sources, the substrate which transmits the visible light or the ultraviolet light may be made of sapphire.

Thus, the white light emitting element according to the present invention comprises not only the semiconductor layer for emitting blue light and the semiconductor or fluorescent layer for emitting yellow or green light but also the semiconductor layer for emitting red light. Consequently, the white light emitted from the white light emitting element according to the present invention is composed of blue light, yellow or green light, and red light. Accordingly, the white light emitting element according to the present invention emits white light which is higher in color rendering property than white light emitted from a conventional white light source which excites a YAG fluorescent material with light from a blue light emitting diode.

Since the white light source according to the present invention comprises the above-mentioned white light emitting element according to the present invention, it can emit white light having a high color rendering property.

This renders the present invention useful as a technology for improving the color rendering property of white light emitted from a white light source such as a white light emitting diode (LED).

BRIEF DESCRIPTION OF THE DRAWINGS

FIG. 1 is a schematic diagram showing a white light source 1 in a first embodiment of the present invention;

DESCRIPTION OF THE PREFERRED EMBODIMENTS

Figure 17:
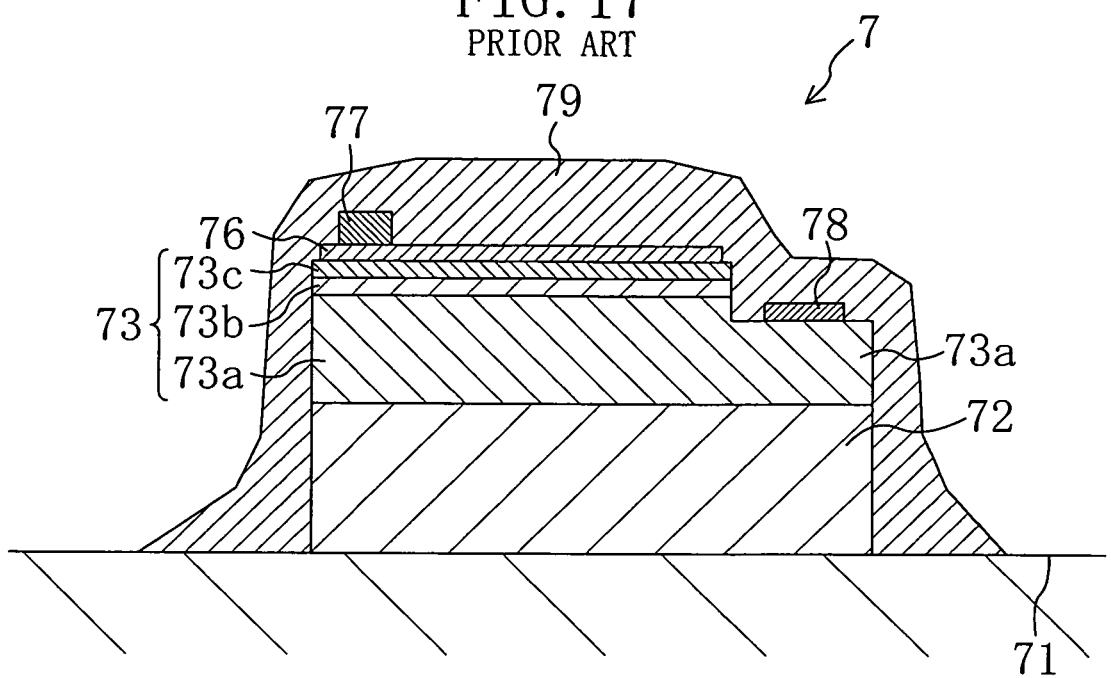
FIG. 17 is a schematic diagram showing a white light source 7 in a comparative embodiment.
Figure 18:
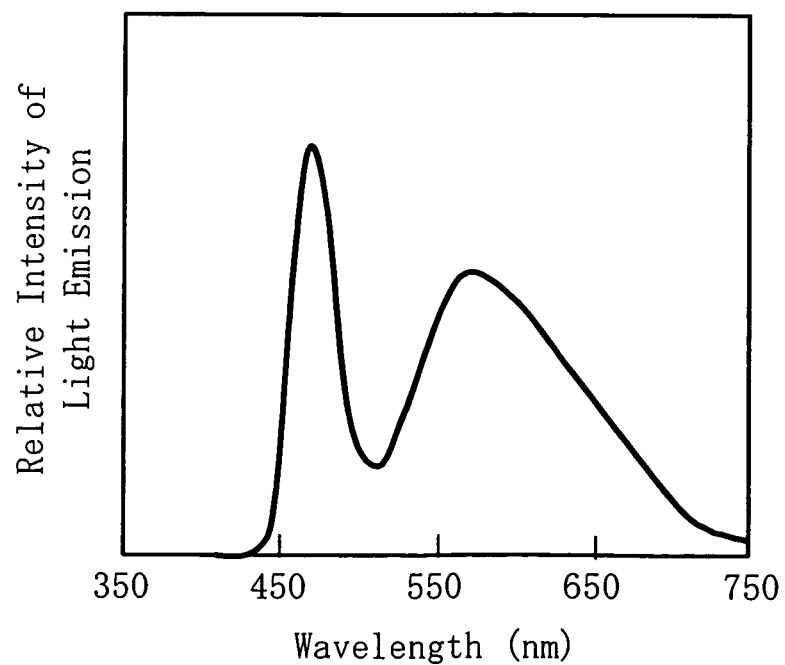
FIG. 18 is a spectrum chart of light emitted from the white light source 7 in the comparative embodiment.

Before describing the individual embodiments of the present invention, a description will be given first to a structure of a white light source 7 as a comparative embodiment, which uses a GaN-based blue light emitting diode as an excitation light source and uses a YAG fluorescent material as a white light emitting element, and to the mechanism of the emission of white light from the white light source 7 with reference to FIGS. 17 and 18, of which FIG. 17 is a cross-sectional view showing the structure of the white light source 7 according to the comparative embodiment and FIG. 18 is a spectrum chart of light from the white light source 7 shown in FIG. 17.

First, the structure of the white light source 7 will be described.

As shown in FIG. 17, the white light source 7 comprises: a substrate 72 formed on a surface of a package 71; a semiconductor layer 73 formed on a surface of the substrate 72; electrodes 76, 77, and 78 formed on a surface of the semiconductor layer 73; and a fluorescent layer 79 formed to cover the semiconductor layer 73 and the electrodes 76, 77, and 78. The substrate 72 is made of sapphire and transmits visible light. The semiconductor layer 73 is composed of three compound semiconductor layers which are an n-type InGaAlN layer 73a, an InGaAlN active layer 73b, and a p-type InGaAlN layer 73c stacked in this order. The InGaAlN active layer 73b and the p-type InGaAlN layer 73c have been partly removed so that the n-type InGaAlN layer 73a composing the semiconductor layer 73 has been partly exposed. The Ni/Au transparent electrode 76 is formed on a surface of the p-type InGaAlN layer 73c. The Au electrode 77 has been formed on a portion of a surface of the Ni/Au transparent electrode 76. The Ti/Au electrode 78 has been formed on the exposed surface of the n-type InGaAlN layer 73a.

Next, a method for fabricating the white light source 7 will be shown.

First, the n-type InGaAlN layer 73a, the InGaAlN active layer 73b, and the p-type InGaAlN layer 73c are formed in this order by, e.g. MOCVD (Metal Organic Chemical Vapor Deposition) on the substrate 72 made of sapphire.

Next, dry etching using, e.g., a $Cl_2$ gas is performed with respect to the InGaAlN active layer 73b and the p-type InGaAlN layer 73c. Then, the Ti/Au electrode 78 is formed on the surface (the surface of the n-type InGaAlN layer 73a) to which dry etching has been performed. This allows the extraction of an electrode onto the n-type semiconductor layer via the Ti/Au electrode 78 and allows the formation of a bonding pad on the n-type InGaAlN layer 73a. On the other hand, the Ni/Au transparent electrode 76 is formed on the surface portion of the p-type InGaAlN layer 73c that has not undergone dry etching and the Au electrode 77 is formed on a portion of a surface of the Ni/Au transparent electrode 76. At this time, the Ni/Au electrode 76 can be formed as the transparent electrode by adjusting the film thickness of the Ni/Au electrode 76 to 10 nm or less.

Subsequently, the semiconductor layer with the electrodes fabricated by the foregoing process steps is divided into light emitting diode chips each configured as a square with 300-μm sides. Each of the light emitting diode chips is mounted on the surface of the package 71 and subjected to wire bonding.

Thereafter, a YAG fluorescent material is applied dropwise onto the package 71 and hardened to form the fluorescent layer 79 covering the semiconductor layer 73 and the electrodes 76, 77, and 78, whereby the fabrication of the white light source 7 is complete.

Next, the mechanism of the emission of white light from the white light source 7 will be described.

When an external voltage is applied to the Au electrode 77 and to the Ti/Au electrode 78 in the white light source 7, a current flows in the white light source 7. In response, the InGaAlN active layer 73b emits blue light with a peak wavelength of 470 nm. Since the Ni/Au electrode 76 is a transparent electrode, the blue light passes through the Ni/Au electrode 76 and excites the fluorescent layer 79. On absorbing the blue light, the YAG fluorescent material emits yellow light with a peak wavelength of about 550 nm. Accordingly, the blue light absorbed by the YAG fluorescent material becomes the yellow light, which is emitted from the fluorescent layer 79, while the portion of the blue light that has not been absorbed by the fluorescent layer 79 passes through the fluorescent layer 79. Thus, as shown in FIG. 21, the light emitted from the white light source 7 is white light composed of the yellow light (the peak on the right side of FIG. 18) emitted from the fluorescent layer 79 and the portion of the blue excitation light (the peak on the left side of FIG. 18) that has not been absorbed by the fluorescent layer 79. As a result, the light emitted from the white light source 7 becomes the white light composed of the blue light and the yellow light.

However, since the white light emitted from the white light source 7 is composed of two colors, the ratio of the red component in the spectrum of the white color to the other color components is low so that the color rendering property of the white light is poor. The poor color rendering property of the white light (the low color rendering property of the white light) indicates that a target object appears differently when it is illuminated with the white light and with natural light. Conversely, the excellent color rendering property of the white light (the high color rendering property of the white light) indicates that the target object appears substantially the same when it is illuminated with the white light and with natural light. To use white light for illumination, therefore, it is preferable to use white light having an excellent color rendering property. In view of the foregoing, the present invention which improves the color rendering property of white light emitted from a white light source has been achieved by using a white light emitting element comprising not only a semiconductor layer which emits blue light and a semiconductor or fluorescent layer which emits yellow light but also a semiconductor or fluorescent layer which emits red light as the white light emitting element of a white light source. The following is the individual embodiments of the present invention, which are exemplary and not restrictive of the invention.

Embodiment 1

Figure 2A:
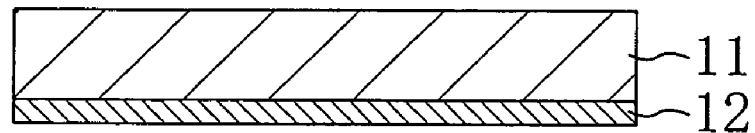
FIGS. 2A through 2C are views illustrating a method for fabricating a white light source 1' with a white light emitting element 10 integrated therein in the first embodiment.
Figure 2B:
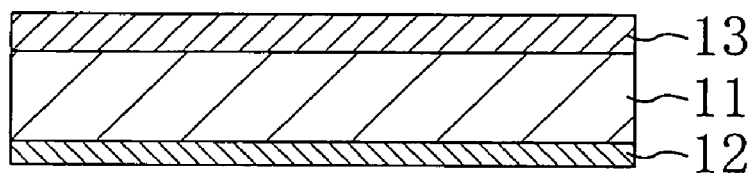
Figure 2C:
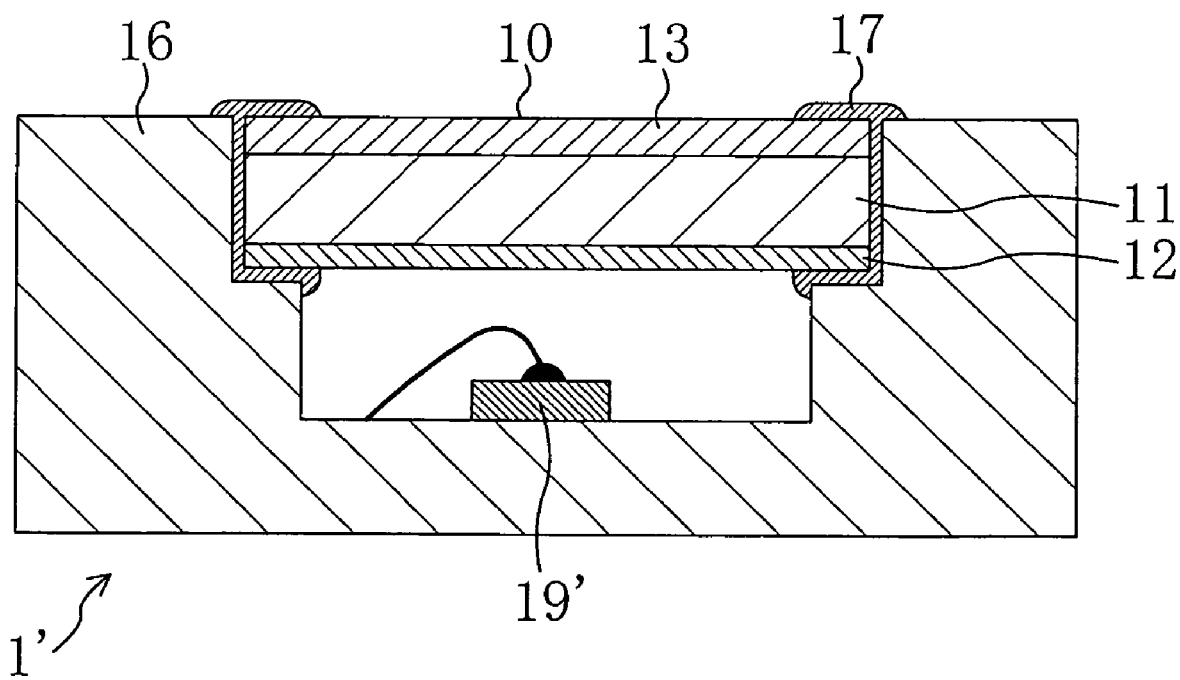
Figure 3:
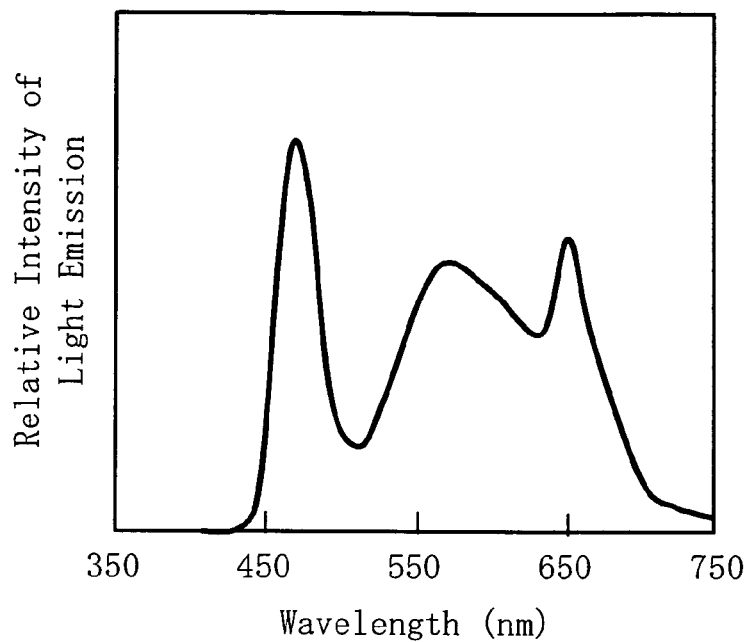
FIG. 3 is a spectrum chart of light emitted from the white light source 1 in the first embodiment.

Referring to FIGS. 1 through 3, a first embodiment of the present invention will be described herein below.

In the present embodiment, a description will be given to a structure of a white light source 1, a method for fabricating the white light source 1, and the mechanism of the emission of white light from the white light source 1. FIG. 1 is a schematic diagram of the white light source 1 in the present embodiment. FIGS. 2A through 2C are views illustrating the method for fabricating the white light source 1 in the present embodiment. FIG. 3 is a spectrum chart of light emitted from the white light source 1 in the present embodiment.

First, the structure of the white light source 1 will be described.

As shown in FIG. 1, the white light source 1 comprises: an excitation light source 19; and a white light emitting element 10 provided at a position which allows the transmission of light emitted from the excitation light source 19. The white light emitting element 10 comprises: a sapphire substrate (substrate) 11 which transmits light emitted from the excitation light source 19; a semiconductor layer 12 epitaxially grown on a surface of the sapphire substrate 11; and a fluorescent layer 13 formed on the surface of the sapphire substrate 11 opposite to the surface thereof provided with the semiconductor layer 12. As can be seen, for example, in FIG. 1, the excitation light source 19 can be placed apart from the light emitting element.

The excitation light source 19 is a blue light emitting diode which emits blue light with a peak wavelength of 470 nm. The semiconductor layer 12 is made of $Al_xGa_yIn_{(1-x-y)}N$ ($0 \leq x \leq 1$, $0 \leq y \leq 1$, $0 \leq 1-x-y \leq 1$) such as, e.g., $In_{0.4}Ga_{0.6}N$. The forbidden band width of the semiconductor layer 12 is 1.9 eV. Accordingly, the semiconductor layer 12 emits red light with a peak wavelength of 650 nm when it is irradiated with visible light (e.g., blue light) or with ultraviolet light. The semiconductor layer 12 emits red light with a peak wavelength of 650 nm. The fluorescent layer 13 is made of a YAG fluorescent material. Accordingly, the fluorescent layer 13 emits yellow light with a peak wavelength of 550 nm when it is irradiated with visible light (e.g., blue light) or with ultraviolet light.

Next, a method for fabricating a white light source 1' with the white light emitting element 10 integrated therein will be described.

First, an $In_{0.4}Ga_{0.6}N$ layer serving as the semiconductor layer 12 is formed by MOCVD on the surface of the sapphire substrate 11. As a result, the semiconductor layer 12 is grown epitaxially on the sapphire substrate 11. At this time, the surface of the sapphire substrate 11 is the (0001) plane of sapphire.

Next, as shown in FIG. 2B, a YAG fluorescent layer serving as the fluorescent layer 13 is formed on the surface of the sapphire substrate 11 opposite to the surface with the epitaxially grown semiconductor layer 12. Thus, the semiconductor layer 12 and the fluorescent layer 13 are formed individually on the both surfaces of the sapphire substrate 11, whereby the white light emitting element 10 shown in FIG. 1 is formed. It is also possible to polish the sapphire substrate 11 and reduce the thickness thereof to, e.g., 100 μm or less before forming the fluorescent layer 13.

Then, the white light emitting element 10 is diced into squares with, e.g., 1-mm sides. Thereafter, a blue light emitting diode chip 19' serving as the excitation light source 19 of the white light source 1 is provided on a package 16 and the white light emitting element 10 is adhered to the package 16 by using an adhesive agent 17 as shown in FIG. 2C, whereby the white light source 1' miniaturized for commercial use is fabricated.

Subsequently, the mechanism of the emission of the white light from the white light source 1 will be described with reference to FIG. 1. The arrows shown in FIG. 1 represent light components emitted from the semiconductor layer 12, the fluorescent layer 13, and the excitation light source 19.

In general, when the $In_{0.4}Ga_{0.6}N$ layer is irradiated with blue light with a peak wavelength of 470 nm, the blue light is absorbed and red light is emitted. When the YAG fluorescent layer is irradiated with blue light with a peak wavelength of 470 nm, the blue light is absorbed and yellow light is emitted. The present embodiment has used a blue light emitting diode as the excitation light source 19 and provided the white light emitting element 10 at a position which allows the transmission of light from the excitation light source 19.

When the blue light emitted from the excitation light source 19 has reached the white light emitting element 10, a portion of the blue light is absorbed by the semiconductor layer 12. Consequently, the semiconductor layer 12 emits red light with a peak wavelength of 650 nm. The red light passes through the sapphire substrate 11 and the fluorescent layer 13 to be radiated to the outside of the white light emitting element 10.

The portion of the blue light that has not been absorbed by the semiconductor layer 12 passes through the sapphire substrate 11 and reaches the fluorescent layer 13 so that the portion of the blue light is partly absorbed by the fluorescent layer 13. Consequently, the fluorescent layer 13 emits yellow light with a peak wavelength of 550 nm, which is radiated to the outside of the white light emitting element 10.

The portion of the blue light that has not been absorbed by the semiconductor layer 12 and the fluorescent layer 13 passes through the semiconductor layer 12, the sapphire substrate 11, and the fluorescent layer 13 to be radiated to the outside of the white light emitting element 10.

Thus, when the white light emitting element 10 is irradiated with the blue light emitted from the excitation light source 19, the white light emitting element 10 emits the white light composed of the red light emitted from the semiconductor layer 12, the yellow light emitted from the fluorescent layer 13, and the blue light emitted from the excitation light source 19 and passing through the white light emitting element 10 without being absorbed. Specifically, as shown in FIG. 3, the white light source 1 emits the white light composed of the red light with a peak wavelength of 650 nm (the peak on the right side), the yellow light with a peak wavelength of 550 nm (the peak at the center), and the blue light with a peak wavelength of 470 nm (the peak on the left side). In the comparative embodiment, the white light emitted from the white light source 7 is composed of the blue light and the yellow light, while the white light emitted from the white light source 1 contains the red light in addition to the blue light and the yellow light. Accordingly, the color rendering property of the white light emitted from the white light source 1 is higher than that of the white light emitted from the white light source 7 in the comparative embodiment.

The effects achieved by the white light source 1 and the white light emitting element 10 in the present embodiment will be shown herein below.

The white light emitted from the white light source 7 in the comparative embodiment has been composed of the portion of the blue light emitted from the excitation light source and having passed through the semiconductor layer and the fluorescent layer and the yellow light emitted through the absorption of the portion of the blue light by the fluorescent layer. On the other hand, the white light emitting element 10 comprises the semiconductor layer 12 which emits the red light with a peak wavelength of 650 nm and the fluorescent layer 13 which emits the yellow light with a peak wavelength of 550 nm when they are irradiated with the blue light with a peak wavelength of 470 nm. Of the blue light emitted from the excitation light source 19, the portion that has not been absorbed by the semiconductor layer 12 and the fluorescent layer 13 passes through the white light emitting element 10. Consequently, the white light emitted from the white light source 1 is composed of the red light, the yellow light, and the blue light. Since the red light is contained additionally in the white light emitted from the white light source according to the comparative embodiment, the color rendering property of the white light emitted from the white light source 1 is improved compared with that of the white light emitted from the white light source 7 in the comparative embodiment. By merely providing the semiconductor layer 12 which emits red light in the white light emitting element in the comparative embodiment, the color rendering property of white light can be enhanced.

In the present embodiment, the surface of the sapphire substrate 11 is not limited to the (0001) plane of sapphire and any surface orientation may be assumed. For example, a surface orientation at an off-angle from a representative surface, such as the (0001) plane of sapphire, may also be assumed.

Although the present embodiment has used the sapphire substrate 11 as the substrate, the substrate is not limited thereto. Any substrate may be used provided that it transmits visible light. For example, a substrate made of SiC, Si, or GaAs may also be used. In the case of using the substrate made of Si or GaAs, it is necessary to cause the crystal growth of a semiconductor and then separate and remove the semiconductor.

A method for crystal growth used to form the semiconductor layer 12 on the sapphire substrate 11 is not limited to MOCVD. The crystal growth may also be caused by, e.g., MBE (Molecular Beam Epitaxy) or HVPE (Hydride Vapor Phase Epitaxy).

The semiconductor layer 12 may contain a group V element such as As or P or a group III element such as B as a constituent element. The semiconductor layer 12 may also contain Zn, Mg, or Si as an impurity. In the case where Zn, Mg, or Si is contained as an impurity, the semiconductor layer 12 emits red light due to the recombination between electrons and holes via the energy level of the contained impurity.

Alternatively, a GaN underlie layer or a thin-film buffer layer made of GaN or AlN may also be formed between the sapphire substrate 11 and the semiconductor layer 12. The semiconductor layer 12 may also be constituted to contain a multiple quantum well structure for improved brightness or composed of $In_xGa_{(1-x)}N$ ($0 \leq x \leq 1$) of which the In composition need not be uniform in the plane thereof.

Further, the fluorescent layer 13 may also be formed on the surface provided with the semiconductor layer 12.

In the excitation light source 19, the element which emits the blue light may be a semiconductor layer made of $Al_xGa_yIn_{(1-x-y)}N$ ($0 \leq x \leq 1$, $0 \leq y \leq 1$, $0 \leq 1-x-y \leq 1$) or a semiconductor layer represented by a compositional formula other than the above.

Embodiment 2

Figure 4:
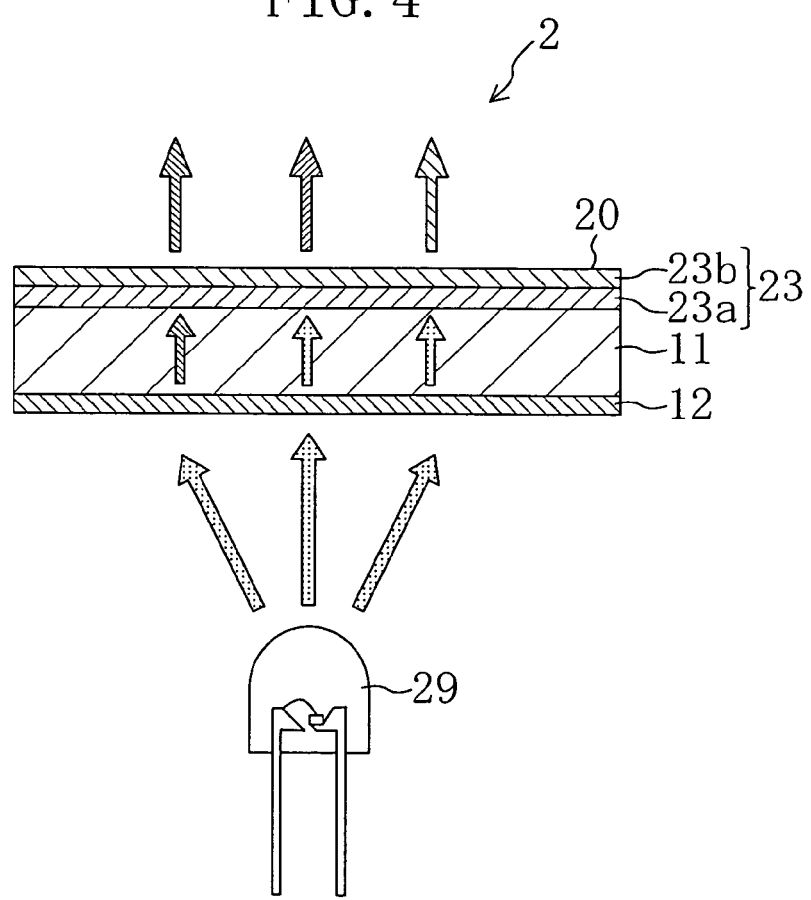
FIG. 4 is a schematic diagram showing a white light source 2 in a second embodiment of the present invention.
Figure 5:
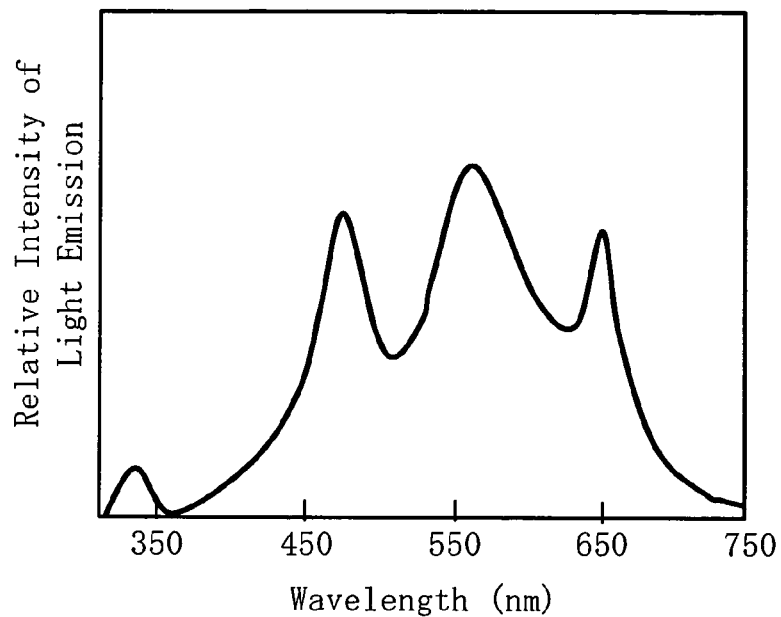
FIG. 5 is a spectrum chart of light emitted from the white light source 2 in the second embodiment.

Referring to FIGS. 4 and 5, a second embodiment of the present invention will be described herein below.

In the present embodiment, a description will be given to a structure of a white light source 2, a method for fabricating the white light source 2, and the mechanism of the emission of white light from the white light source 2. FIG. 4 is a schematic diagram of the white light source 2 according to the present embodiment. FIG. 5 is a spectrum chart of light emitted from the white light source 2 in the present embodiment. In FIG. 4, portions indicating the same materials and functions as shown in FIG. 1 are designated by the same reference numerals as used in FIG. 1.

The white light source 2 according to the present embodiment is different from the white light source 1 according to the first embodiment described above in that light emitted from an excitation light source 29 is ultraviolet light and a fluorescent layer 23 is composed of two layers.

First, the structure of the white light source 2 will be described.

As shown in FIG. 4, the white light source 2 comprises: the excitation light source 29; and the white light emitting element 20 provided at a position which allows the transmission of light from the excitation light source 29. The white light emitting element 20 comprises: a sapphire substrate 11 which transmits light from the excitation light source 29; a semiconductor layer 12 epitaxially grown on a surface of the sapphire substrate 11; and the fluorescent layer 23 formed on the surface opposite to the surface provided with the semiconductor layer 12.

The excitation light source 29 is an ultraviolet light emitting diode which emits ultraviolet light with a peak wavelength of 340 nm. The first embodiment described above has used the blue light emitting diode as the excitation light source 19 so that the blue light composing the white light emitted from the white light source 1 is the light emitted from the excitation light source 19. By contrast, the present embodiment uses the ultraviolet light emitting diode as the excitation light source 29. Accordingly, the blue light composing the white light emitted from the white light source 2 is not the light emitted from the excitation light source 29 but the light emitted from the fluorescent layer 23 through the absorption of the ultraviolet light from the excitation light source 29 thereby. In other words, the white light emitted from the while light source 2 is determined only by the light emitted through the absorption of the ultraviolet light from the excitation light source 29. This allows the color rendering property of the white light emitted from the white light source 2 to be controlled more easily than that of the white light emitted from the white light source 1 according to the first embodiment described above and allows the emission of white light having excellent reproducibility and an excellent color rendering property.

The semiconductor layer 12 is made of $In_{0.4}Ga_{0.6}N$ and the forbidden band width thereof is 1.9 eV. Accordingly, the semiconductor layer 12 emits red light with a peak wavelength of 650 nm when it is irradiated with visible light or ultraviolet light. The fluorescent layer 23 is composed of: a fluorescent layer 23a which emits green light through irradiation with visible light or ultraviolet light (hereinafter referred to as "green light emitting fluorescent layer"); and a fluorescent layer 23b which emits blue light through irradiation with visible light or ultraviolet light (hereinafter referred to as "blue light emitting fluorescent layer").

Next, the method for fabricating a white light source (not shown) with the white light emitting element 20 integrated therein will be described.

In the present embodiment, the green light emitting fluorescent layer 23a and the blue light emitting fluorescent layer 23b may be provided appropriately instead of providing the YAG fluorescent layer in the step (the step shown in FIG. 2B) of forming the YAG fluorescent layer serving as the fluorescent layer 13 on the surface of the sapphire substrate opposite to the surface thereof provided with the semiconductor layer 12 according to the first embodiment. Otherwise, the fabrication method according to the present embodiment is the same as the method for fabricating the white light source 1' with the white light emitting element 10 integrated therein according to the first embodiment described above.

Subsequently, the mechanism of the emission of white light from the white light source 2 will be described with reference to FIG. 4. The arrows shown in FIG. 4 represent light components emitted from the semiconductor layer 12, the fluorescent layer 23, and the excitation light source 29.

In the white light source 2, the ultraviolet light emitting diode is used as the excitation light source 29 and the white light emitting element 20 is provided at a position which allows the transmission of light from the excitation light source 29.

When the ultraviolet light emitted from the excitation light source 29 has reached the white light emitting element 20, a portion of the ultraviolet light is absorbed by the semiconductor layer 12. Consequently, the semiconductor layer 12 emits red light with a peak wavelength of 650 nm. The red light passes through the sapphire substrate 11 and the fluorescent layer 23 to be radiated to the outside of the white light emitting element 20.

The portion of the ultraviolet light that has not been absorbed by the semiconductor layer 12 passes through the sapphire substrate 11 and reaches the green light emitting fluorescent layer 23a so that the portion of the ultraviolet light is partly absorbed by the green light emitting fluorescent layer 23a. Accordingly, the green light emitting fluorescent layer 23a emits green light with a peak wavelength of 550 nm, which passes through the blue light emitting fluorescent layer 23b to be radiated to the outside of the white light emitting element 20.

The portion of the ultraviolet light that has not been absorbed by the semiconductor layer 12 and the green light emitting fluorescent layer 23a is partly absorbed by the blue light emitting fluorescent layer 23b. Accordingly, the blue light emitting fluorescent layer 23b emits blue light with a peak wavelength of 470 nm, which is radiated to the outside of the white light emitting element 20.

Thus, when the white light emitting element 20 is irradiated with the ultraviolet light emitted from the excitation light source 29, the white light emitting element 20 emits the white light composed of the red light emitted from the semiconductor layer 12, the green light emitted from the green light emitting fluorescent layer 23a of the fluorescent layer 23, and the blue light emitted from the blue light emitting fluorescent layer 23b of the fluorescent layer 23. Specifically, as shown in FIG. 5, the white light source 2 emits the white light composed of the red light with a peak wavelength of 650 nm (the peak on the right side), the green light with a peak wavelength of 550 nm (the peak at the center), and the blue light with a peak wavelength of 470 nm (the peak on the left side). Accordingly, the white light emitted from the white light source 2 is composed of the white light emitted from the white light source 7 in the comparative embodiment and the red light added thereto so that the color rendering property of the white light emitted from the white light source 2 is higher than that of the white light emitted from the white light source 7.

It is to be noted that the peak observed in the vicinity of 340 nm in the spectrum shown in FIG. 5 has resulted from the radiation of the portion of the ultraviolet light that has not been absorbed by the semiconductor layer 12 and the fluorescent layer 23 to the outside of the white light emitting element 20.

The effects achieved by the white light source 2 and the white light emitting element 20 in the present embodiment will be shown herein below. The fluorescent material used in the present embodiment has been used widely for fluorescent lamps so that the brightness thereof is sufficiently high. Accordingly, the color rendering property of the white light emitted from the white light source 2 is improved.

Although it is assumed in the present embodiment that the fluorescent layer 23 is composed of the green light emitting fluorescent layer 23a and the blue light emitting fluorescent layer 23b, the fluorescent layer 23 need not have a layered structure. It is sufficient for the fluorescent layer 23 to merely contain a fluorescent material which emits green light and a fluorescent material which emits blue light.

Embodiment 3

Figure 6:
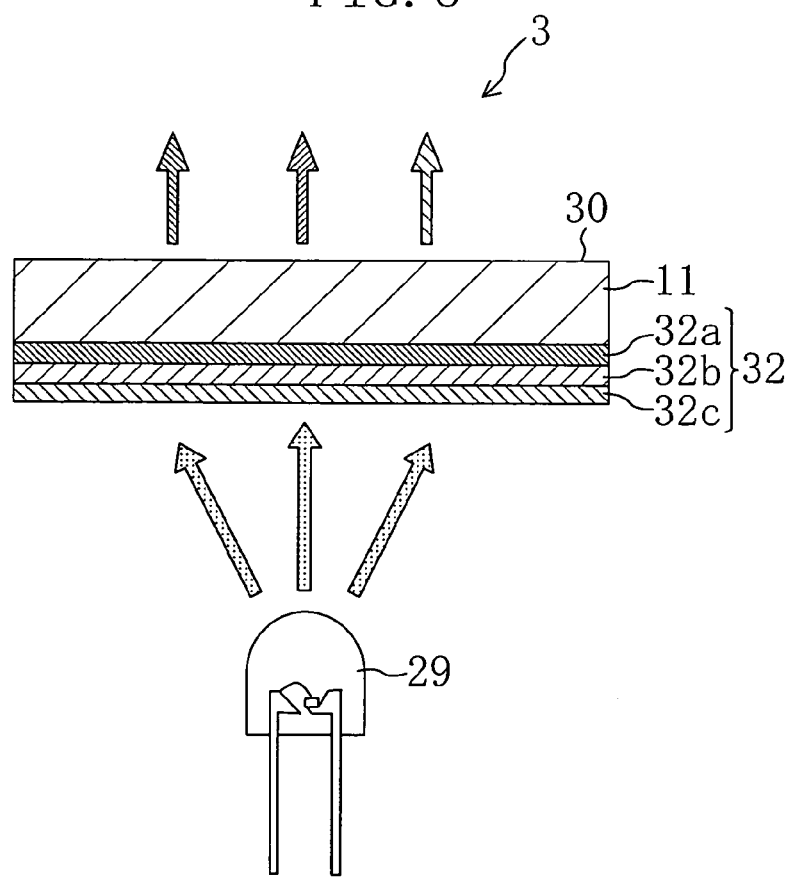
FIG. 6 is a schematic diagram showing a white light source 3 in a third embodiment of the present invention.
Figure 7A:
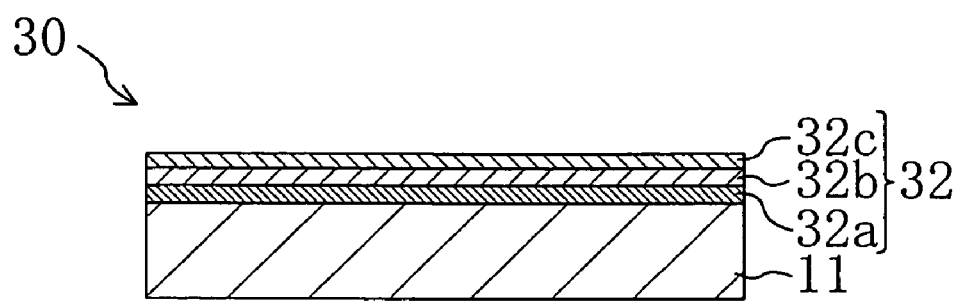
FIGS. 7A and 7B are views illustrating a method for fabricating a white light source 3' with a white light emitting element 30 integrated therein in the third embodiment.
Figure 7B:
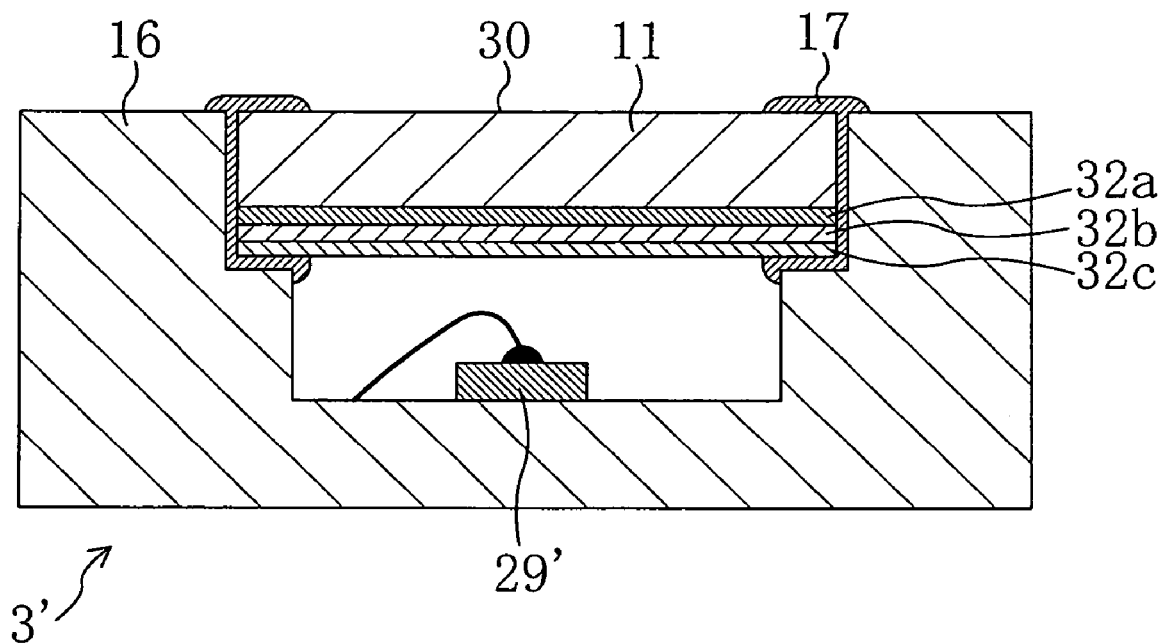

Referring to FIGS. 6 and 7B, a third embodiment of the present invention will be described herein below.

In the present embodiment, a description will be given to a structure of a white light source 3, a method for fabricating the white light source 3, and the mechanism of the emission of white light from the white light source 3. FIG. 6 is a schematic diagram of the white light source 3 in the present embodiment. FIGS. 7A and 7B are views illustrating the method for fabricating the white light source 3 in the present embodiment. In FIG. 6, portions indicating the same materials and functions as shown in FIG. 1 are designated by the same reference numerals as used in FIG. 1.

The white light emitting element 30 according to the present embodiment is different from the white light emitting element 10 according to the first embodiment described above in that it does not comprise a fluorescent layer and comprises a semiconductor layer 32 composed of three layers.

First, the structure of the white light source 3 will be described.

As shown in FIG. 6, the white light source 3 comprises: the excitation light source 29; and the white light emitting element 30 provided at a position which allows the transmission of light from the excitation light source 29. The white light emitting element 30 comprises: a sapphire substrate 11 which transmits light from the excitation light source 29; and the semiconductor layer 32 epitaxially grown on a surface of the sapphire substrate 11.

The excitation light source 29 is an ultraviolet light emitting diode which emits ultraviolet light with a peak wavelength of 340 nm. The semiconductor layer 32 is composed of: an InGaAlN layer 32a which emits blue light through irradiation with visible light or ultraviolet light (hereinafter referred to as "blue light emitting InGaAlN layer"); an InGaAlN layer 32b which emits green light through irradiation with visible light or ultraviolet light (hereinafter referred to as "green light emitting InGaAlN layer"); and an InGaAlN layer 32c which emits red light through irradiation with visible light or ultraviolet light (hereinafter referred to as "red light emitting InGaAlN layer"), which are stacked in this order. The blue light emitting InGaAlN layer 32a is made of, e.g., $In_{0.2}Ga_{0.8}N$, the forbidden band width thereof is 2.6 eV, and the peak wavelength of the light emitted therefrom is 470 nm. The green light emitting InGaAlN layer 32b is made of, e.g., $In_{0.3}Ga_{0.7}N$, the forbidden band width thereof is 2.3 eV, and the peak wavelength of the light emitted therefrom is 550 nm. The red light emitting InGaAlN layer 32c is made of, e.g., $In_{0.4}Ga_{0.6}N$, the forbidden band width thereof is 1.9 eV, and the peak wavelength of the light emitted therefrom is 650 nm. It is to be noted that InGaAlN is a simplified representation of $In_{1-x-y}Ga_xAl_yN$ ($0 \leq x \leq 1$, $0 \leq y \leq 1$, $0 \leq 1-x-y \leq 1$).

Next, a method for fabricating a white light source 3' with the white light emitting element 30 integrated therein will be described.

First, a semiconductor layer serving as the blue light emitting InGaAlN layer 32a is formed by MOCVD on the surface of the sapphire substrate 11, a semiconductor layer serving as the green light emitting InGaAlN layer 32b is formed by MOCVD on a surface of the blue light emitting InGaAlN layer 32a, and then a semiconductor layer serving as the red light emitting InGaAlN layer 32c is formed by MOCVD on a surface of the green light emitting InGaAlN layer 32b, whereby the white light emitting element 30 shown in FIG. 7A is formed.

Next, the white light emitting element 30 is diced into squares with, e.g., 1-mm sides. Thereafter, an ultraviolet light emitting diode chip 29' serving as the excitation light source 29 of the white light source 3 is provided on a package 16 and the white light emitting element 30 is adhered to the package 16 by using an adhesive agent 17 as shown in FIG. 7B, whereby the white light source 3' miniaturized for commercial use is fabricated.

Subsequently, the mechanism of the emission of white light from the white light source 3 will be described with reference to FIG. 6.

When the ultraviolet light emitted from the excitation light source 29 has reached the white light emitting element 30, a portion of the ultraviolet light is absorbed by the red light emitting InGaAlN layer 32c. Accordingly, the red light emitting InGaAlN layer 32c emits red light with a peak wavelength of 650 nm. The red light passes through the green light emitting InGaAlN layer 32b, the blue light emitting InGaAlN layer 32a, and the sapphire substrate 11 to be radiated to the outside of the white light emitting element 30.

The portion of the ultraviolet light that has not been absorbed by the red light emitting InGaAlN layer 32c is partly absorbed by the green light emitting InGaAlN layer 32b. Accordingly, the green light emitting InGaAlN layer 32b emits green light with a peak wavelength of 550 nm, which passes through the blue light emitting InGaAlN layer 32a and the sapphire substrate 11 to be radiated to the outside of the white light emitting element 30.

The portion of the ultraviolet light that has not been absorbed by the red light emitting InGaAlN layer 32c and the green light emitting InGaAlN layer 32b is partly absorbed by the blue light emitting InGaAlN layer 32a. Accordingly, the blue light emitting InGaAlN layer 32a emits blue light with a peak wavelength of 470 nm, which passes through the sapphire substrate 11 to be radiated to the outside of the white light emitting element 30.

Thus, when the white light emitting element 30 is irradiated with the ultraviolet light emitted from the excitation light source 29, the white light emitting element 30 emits the white light composed of the blue light emitted from the blue light emitting InGaAlN layer 32a, the green light emitted from the green light emitting InGaAlN layer 32b, and the red light emitted from the red light emitting InGaAlN layer 32c. Accordingly, the white light emitted from the white light source 3 is composed of the white light emitted from the white light source 7 in the comparative embodiment and the red light added thereto so that the color rendering property of the white light emitted from the white light source 3 is higher than that of the white light emitted from the white light source 7.

The effects achieved by the white light source 3 and the white light emitting element 30 in the present embodiment will be shown herein below.

In the present embodiment, the semiconductor layer 32 emits the red light, the green light, and the blue light. This obviates the necessity to provide a fluorescent layer in the white light emitting element 30 and allows the white light emitting element 30 to be fabricated more easily than the white light emitting elements 10 and 20 according to the first and second embodiments. In addition, the white light source 3 and the white light emitting element 30 also achieve the effects described above in the first and second embodiments.

Although the semiconductor layer 32 is composed of the blue light emitting InGaAlN layer 32a, the green light emitting InGaAlN layer 32b, and the red light emitting InGaAlN layer 32c in the present embodiment, the semiconductor layer 32 need not have a layered structure. It is sufficient for the semiconductor layer 32 to merely contain InGaAlN which emits blue light, InGaAlN which emits green light, and InGaAlN which emits red light.

Embodiment 4

Figure 8:
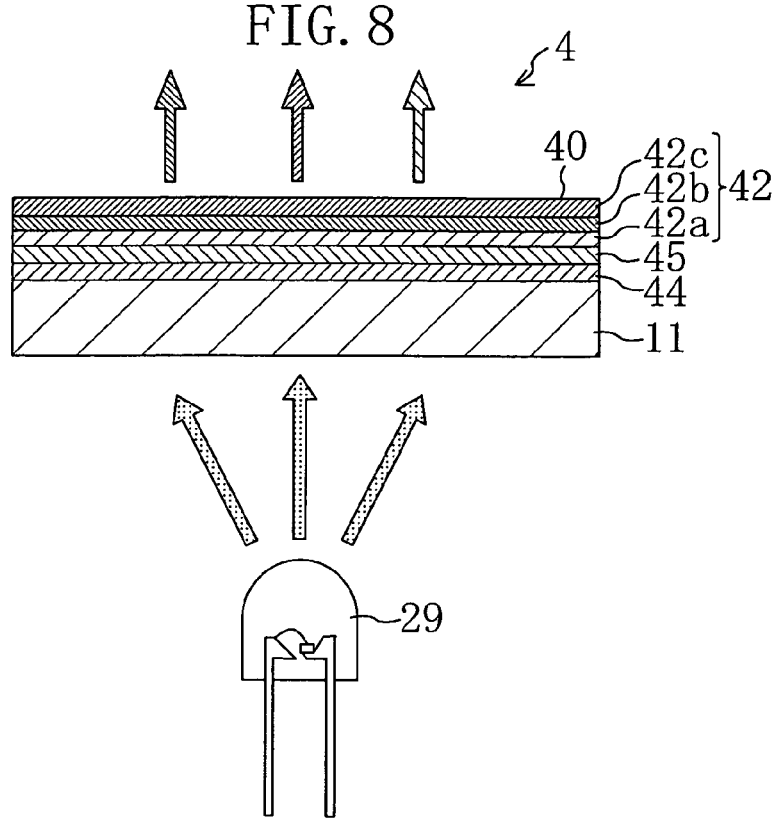
FIG. 8 is a schematic diagram showing a white light source 4 in a fourth embodiment of the present invention.
Figure 9:
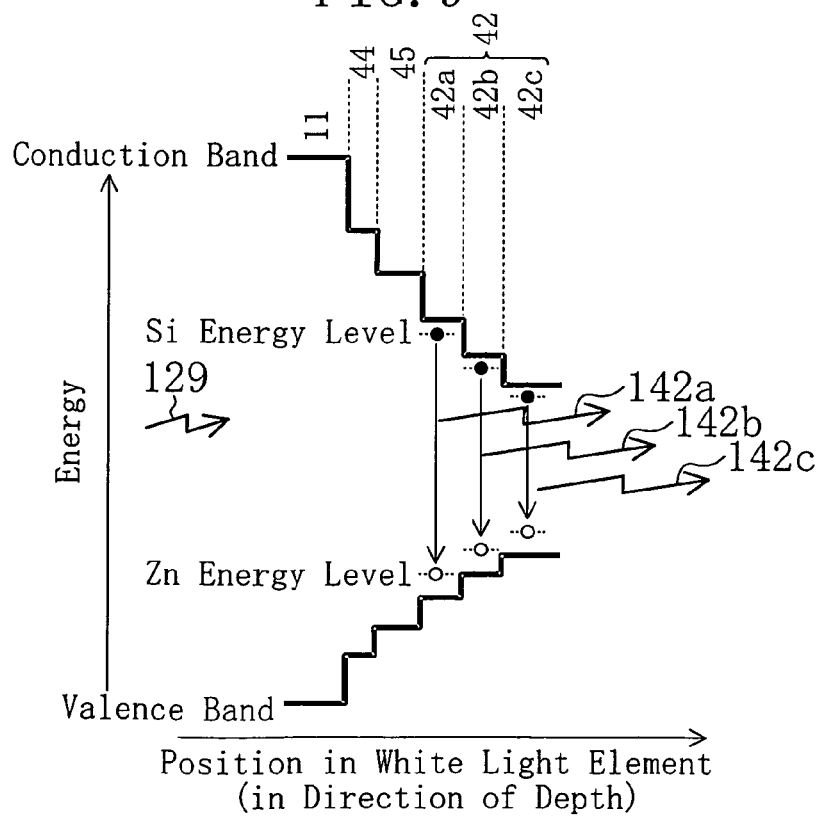
FIG. 9 is a view showing the relationship between the height of a white light emitting element 40 and a forbidden band width in the white light emitting element 40 in the fourth embodiment.
Figure 10:
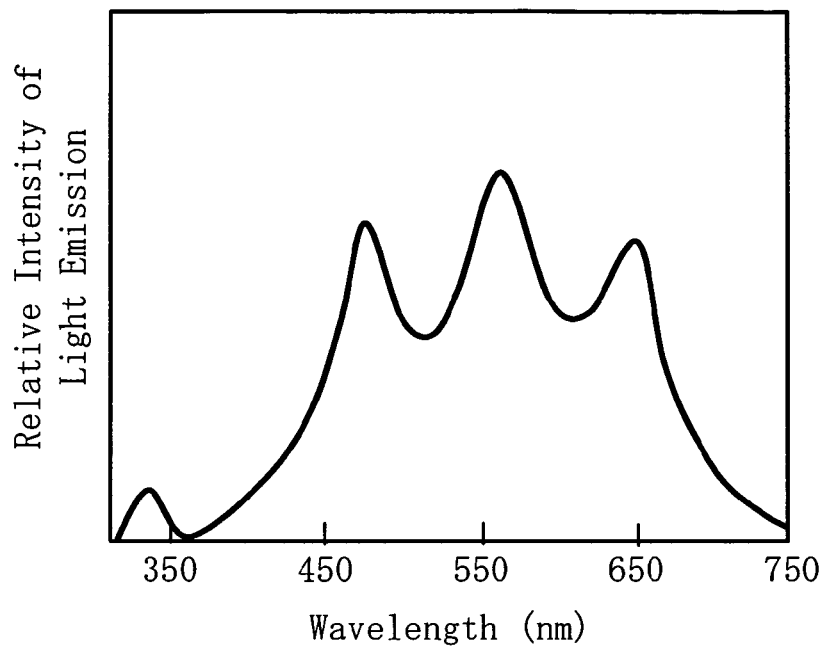
FIG. 10 is a spectrum chart of light emitted from the white light source 4 in the fourth embodiment.

Referring to FIGS. 8 through 10, a fourth embodiment of the present invention will be described herein below.

In the present embodiment, a description will be given to a structure of a white light source 4, a method for fabricating the white light source 4, and the mechanism of the emission of white light from the white light source 4. FIG. 8 is a schematic diagram of the white light source 4 according to the present embodiment. FIG. 9 is a view showing a forbidden band width (band gap) relative to the direction of height of a white light emitting element 40 according to the present embodiment. FIG. 10 is a spectrum chart of light emitted from the white light source 4 in the present embodiment. In FIG. 8, portions indicating the same materials and functions as shown in FIG. 1 are designated by the same reference numerals as used in FIG. 1.

The white light emitting element 40 according to the present embodiment is different from the white light emitting element 10 according to the first embodiment described above in that it semiconductor layers 44 and 45 which are irrelevant to light emission are provided.

First, the structure of the white light source 4 will be described.

As shown in FIG. 8, the white light source 4 comprises: the excitation light source 29; and the white light emitting element 40 provided at a position which allows the transmission of light from the excitation light source 29. The white light emitting element 40 comprises: a sapphire substrate 11 which transmits light from the excitation light source 29; the AlN buffer layer 44 formed on a surface of the sapphire substrate 11; a GaN layer 45 formed on a surface of the AlN buffer layer 44; and a semiconductor layer 42 formed on a surface of the GaN layer 45. The semiconductor layer 42 is composed of a blue light emitting InGaAlN layer 42a, a green light emitting InGaAlN layer 42b, and a red light emitting InGaAlN layer 42c, which are stacked in this order.

The excitation light source 29 is an ultraviolet light emitting diode which emits ultraviolet light with a peak wavelength of 340 nm. The blue light emitting InGaAlN layer 42a, the green light emitting InGaAlN layer 42b, and the red light emitting InGaAlN layer 42c contain Si and Zn and emit blue light, green light, and red light, respectively, due to recombination via the energy levels of Si and Zn. The blue light emitting InGaAlN layer 42a is made of $In_{0.1}Ga_{0.9}N$, the green light emitting InGaAlN layer 42b is made of $In_{0.2}Ga_{0.8}N$, and the red light emitting InGaAlN layer 42c is made of $In_{0.3}Ga_{0.7}N$. Since the white light emitting element 40 comprises the AlN buffer layer 44 and the GaN layer 45, the crystal defect density of the semiconductor layer 42 can be reduced. This reduces nonradiative recombination in the white light emitting element 40 and improves brightness. Each of the AlN buffer layer 44 and the GaN layer 45 has a thickness of about 1 μm.

Next, a method for fabricating a white light source (not shown) with the white light emitting element 40 integrated therein will be described.

First, an AlN layer serving as the AlN buffer layer 44 is formed by MOCVD on the surface of the sapphire substrate 11 and the GaN layer 45 is formed by MOCVD on the surface of the AlN layer. Thereafter, the $In_{0.1}Ga_{0.9}N$ layer serving as the blue light emitting InGaAlN layer 42a, the $In_{0.2}Ga_{0.8}N$ layer serving as the green light emitting InGaAlN layer 42b, and the $In_{0.3}Ga_{0.7}N$ layer serving as the red light emitting InGaAlN layer 42c are formed by MOCVD in this order, whereby the white light emitting element 40 shown in FIG. 8 is formed. By this time, the $In_{0.1}Ga_{0.9}N$ layer, the $In_{0.2}Ga_{0.8}N$ layer, and the $In_{0.3}Ga_{0.7}N$ layer have been doped with Si and Zn.

Next, the white light emitting element 40 is diced into squares with, e.g., 1-mm sides. Thereafter, an ultraviolet light emitting diode chip serving as the excitation light source 29 of the white light source 4 is provided on the package described above in each of the first and third embodiments and the white light emitting element 40 is adhered to the package by using an adhesive agent, whereby the white light source with the white light emitting element 40 integrated therein is fabricated.

The mechanism of the emission of white light from the white light source 4 is substantially the same as the emission of white light from the white light source 3 according to the third embodiment described above. Consequently, as shown in FIG. 10, the white light source 4 emits the white light composed of the red light with a peak wavelength of 650 nm (the peak on the right side), the green light with a peak wavelength of 550 nm (the peak at the center), and the blue light with a peak wavelength of 470 nm (the peak on the left side). Accordingly, the white light emitted from the white light source 4 is composed of the white light emitted from the white light source 7 in the comparative embodiment and the red light added thereto so that the color rendering property of the white light emitted from the white light source 4 is higher than that of the white light emitted from the white light source 7.

Although the semiconductor layer 42 has a structure in which the $In_{0.1}Ga_{0.9}N$ layer, the $In_{0.2}Ga_{0.8}N$ layer, and the $In_{0.3}Ga_{0.7}N$ layer are stacked in the present embodiment, it is not limited thereto. However, if consideration is given to the phenomenon in which the lattice constant of the semiconductor increases with an increase in In composition and to the possibility that the resulting lattice mismatch may cause a crystal defect, it is preferable to control the In, Ga, and Al compositions of InGaAlN, while maintaining the same lattice constant of 3.19 Å as the lattice constant of the a-axis of hexagonal GaN, in terms of suppressing the occurrence of a crystal defect resulting from the lattice mismatch. Even under such control, white light including blue light, green light, and red light, which is similar to the white light emitted from the white light emitting element 40, can be emitted.

Although it is assumed in the present embodiment that the semiconductor layer 42 is composed of the blue light emitting InGaAlN layer 42a, the green light emitting InGaAlN layer 42b, and the red light emitting InGaAlN layer 42c which are stacked in this order, the InGaAlN layers may also be stacked appropriately in the order of the red light emitting InGaAlN layer 42c, the green light emitting InGaAlN layer 42b, and the blue light emitting InGaAlN layer 42a. The blue light emitting InGaAlN layer 42a, the green light emitting InGaAlN layer 42b, and the red light emitting InGaAlN layer 42c need not be doped appropriately with Si and Zn. In that case, the composition ratio of In in each of the InGaAlN layers may be increased appropriately. If the blue light emitting InGaAlN layer 42a is composed of, e.g., $In_{0.2}Ga_{0.8}N$, the same effects as obtained in the present embodiment are obtainable.

Embodiment 5

Figure 11:
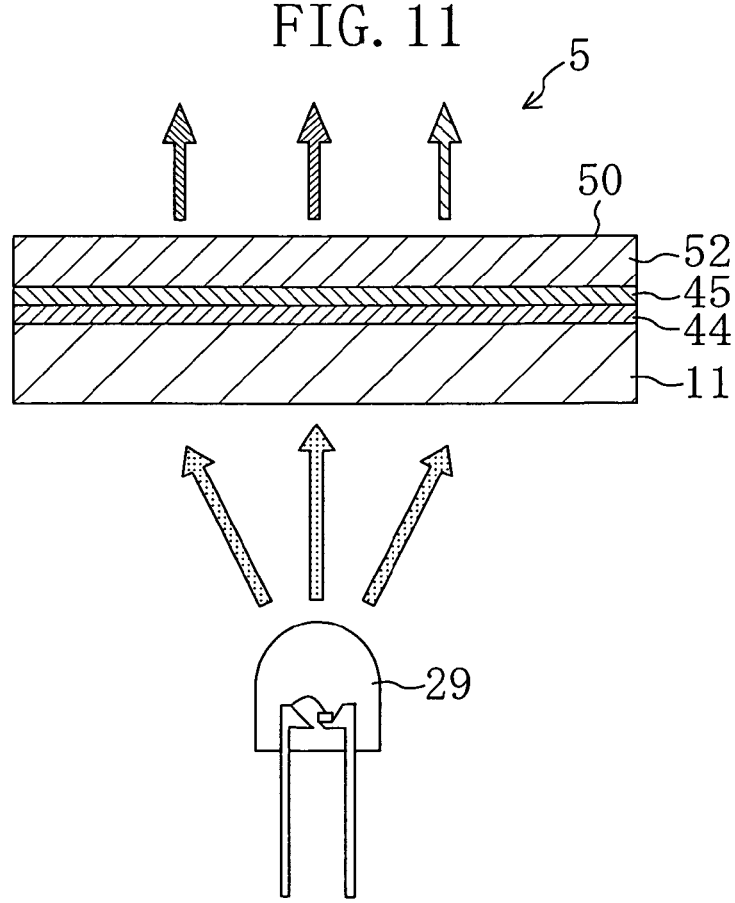
FIG. 11 is a schematic diagram showing a white light source 5 in a fifth embodiment of the present invention.
Figure 12:
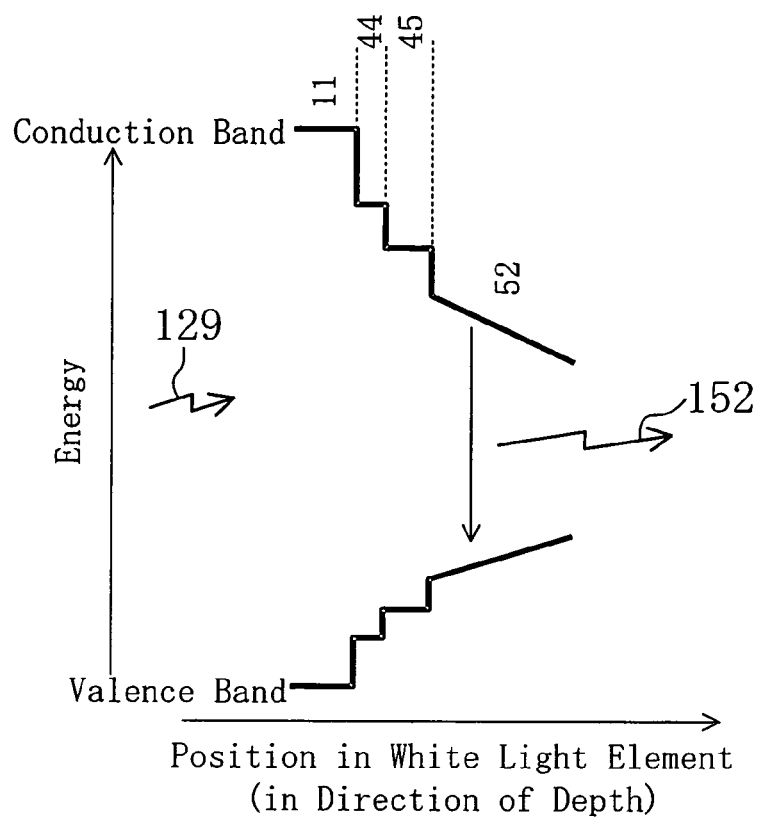
FIG. 12 is a view showing the relationship between the height of a white light emitting element 50 and a forbidden band width in the white light emitting element 50 in the fifth embodiment.
Figure 13:
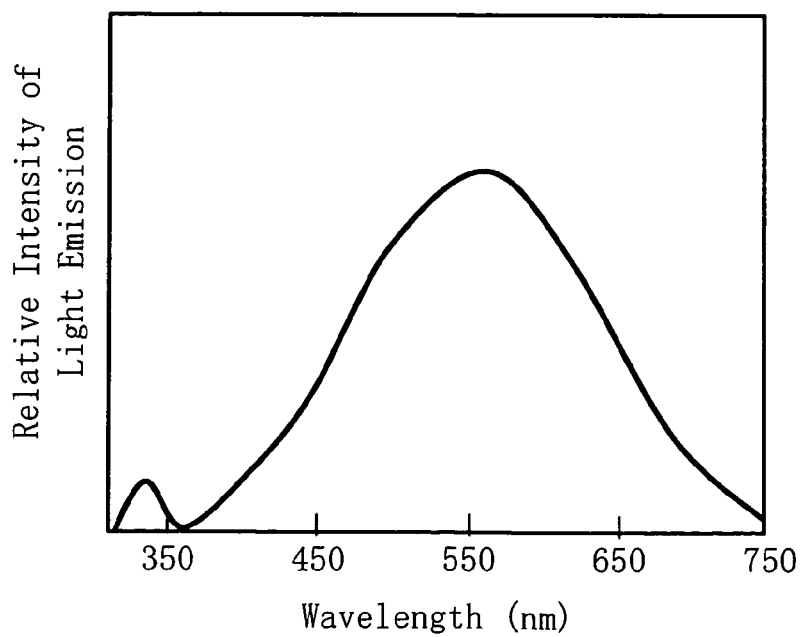
FIG. 13 is a spectrum chart of light emitted from the white light source 5 in the fifth embodiment.

Referring to FIGS. 11 through 13, a fifth embodiment of the present invention will be described herein below.

In the present embodiment, a description will be given to a structure of a white light source 5, a method for fabricating the white light source 5, and the mechanism of the emission of white light from the white light source 5. FIG. 11 is a schematic diagram of the white light source 5 in the present embodiment. FIG. 12 is a view showing a forbidden band width (band gap) relative to the direction of height of the white light emitting element 50 in the present embodiment. FIG. 13 is a spectrum chart of light emitted from the white light source 5 in the present embodiment. In FIG. 11, portions indicating the same materials and functions as shown in FIG. 1 are designated by the same reference numerals as used in FIG. 1.

In the white light emitting element 50 according to the present embodiment, a fluorescent layer is not formed and only one semiconductor layer 52 is formed.

First, the structure of the white light source 5 will be described.

As shown in FIG. 11, the white light source 5 comprises: the excitation light source 29; and the white light emitting element 50 provided at a position which allows the transmission of light from the excitation light source 29. The white light emitting element 50 comprises: a sapphire substrate 11 which transmits light from the excitation light source 29; the AlN buffer layer 44 formed on a surface of the sapphire substrate 11; a GaN layer 45 formed on a surface of the AlN buffer layer 44; and the semiconductor layer 52 formed on a surface of the GaN layer 45.

The excitation light source 29 is an ultraviolet light emitting diode which emits ultraviolet light with a peak wavelength of 340 nm. Each of the AlN buffer layer 44 and the GaN layer 45 is excellent in crystal properties and low in defect density. The element composition of the semiconductor layer 52 is $In_{0.38}Ga_{0.62}N$ in the surface thereof and is InN in the surface of the white light emitting element 50. The element composition ratio changes continuously in a direction from the surface of the GaN layer 45 toward the surface of the white light emitting element 50.

Next, a method for fabricating a white light source (not shown) with the white light emitting element 50 integrated therein will be described.

First, an AlN layer serving as the AlN buffer layer 44 is formed by MOCVD on the surface of the sapphire substrate 11 and the GaN layer 45 is formed by MOCVD on the surface of the AlN layer. Thereafter, the semiconductor layer 52 is formed such that the element composition of the semiconductor is $In_{0.38}Ga_{0.62}N$ in the surface of the GaN layer 45, the composition of Ga decreases and the composition ratio of In increases as more layers are stacked, and the element composition of the semiconductor is InN in the surface of the semiconductor layer 52, whereby the white light emitting element 50 shown in FIG. 11 is formed.

Next, the white light emitting element 50 is diced into squares with, e.g., 1-mm sides. Thereafter, an ultraviolet light emitting diode chip serving as the excitation light source 29 of the white light source 5 is provided on the package described above in each of the first and third embodiments and the white light emitting element 50 is adhered to the package by using an adhesive agent, whereby the white light source with the white light emitting element 50 integrated therein is fabricated.

Subsequently, a description will be given to the mechanism of the emission of light from each of the compound semiconductors and to the mechanism of the emission of white light from the white light source 5 with reference to FIG. 12.

The present embodiment has also utilized the phenomenon in which the value of the forbidden band width of a semiconductor layer varies due to different composition ratios between In and Ga, similarly to the fourth embodiment described above. In the present embodiment, the element composition ratio in the semiconductor layer 52 continuously changes in the direction from the surface of the GaN layer 45 toward the surface of the white light emitting element 50 so that the peak wavelength of light emitted from the white light source 5 does not have discrete values such as 470 nm, 550 nm, and 650 nm, but has indiscrete values such as, e.g., 469 nm, 471 nm, and 472 nm. Accordingly, white light 152 emitted from the white light source 5 includes an infinite number of light components so that the white light emitting element 50 emits light having a wide band as shown in FIG. 13. Consequently, the white light emitted from the white light emitting element 50 is extremely similar to natural light and the color rendering property thereof is extremely higher than

19 that of white light emitted from each of the white light sources in the first to fourth embodiments described above.

Embodiment 6

Figure 15A:
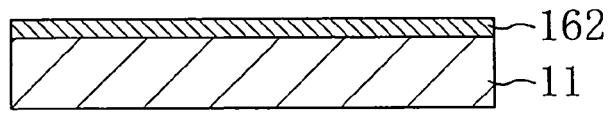
FIGS. 15A through 15D are views illustrating a method for fabricating a white light source 6' with a white light emitting element 60 integrated therein in the sixth embodiment.
Figure 15B:
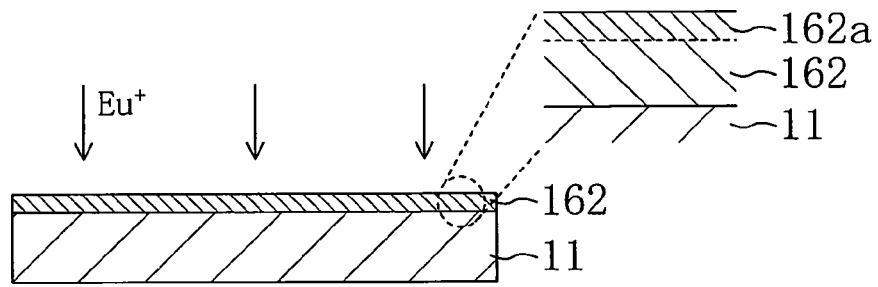
Figure 15C:
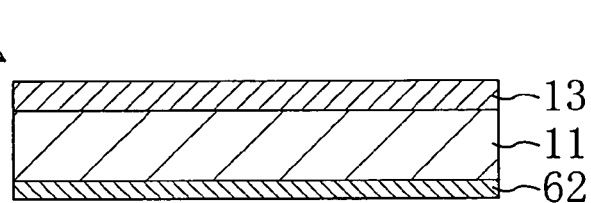
Figure 15D:
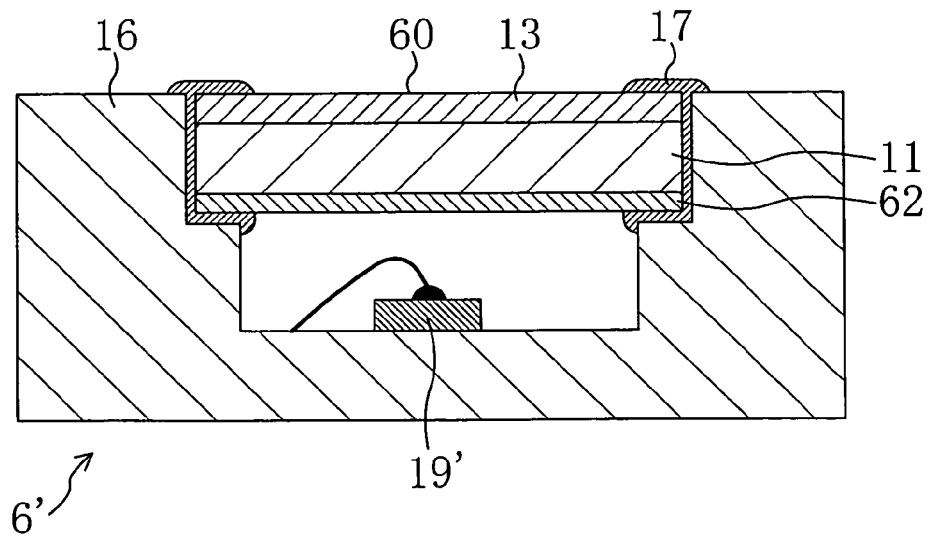
Figure 16:
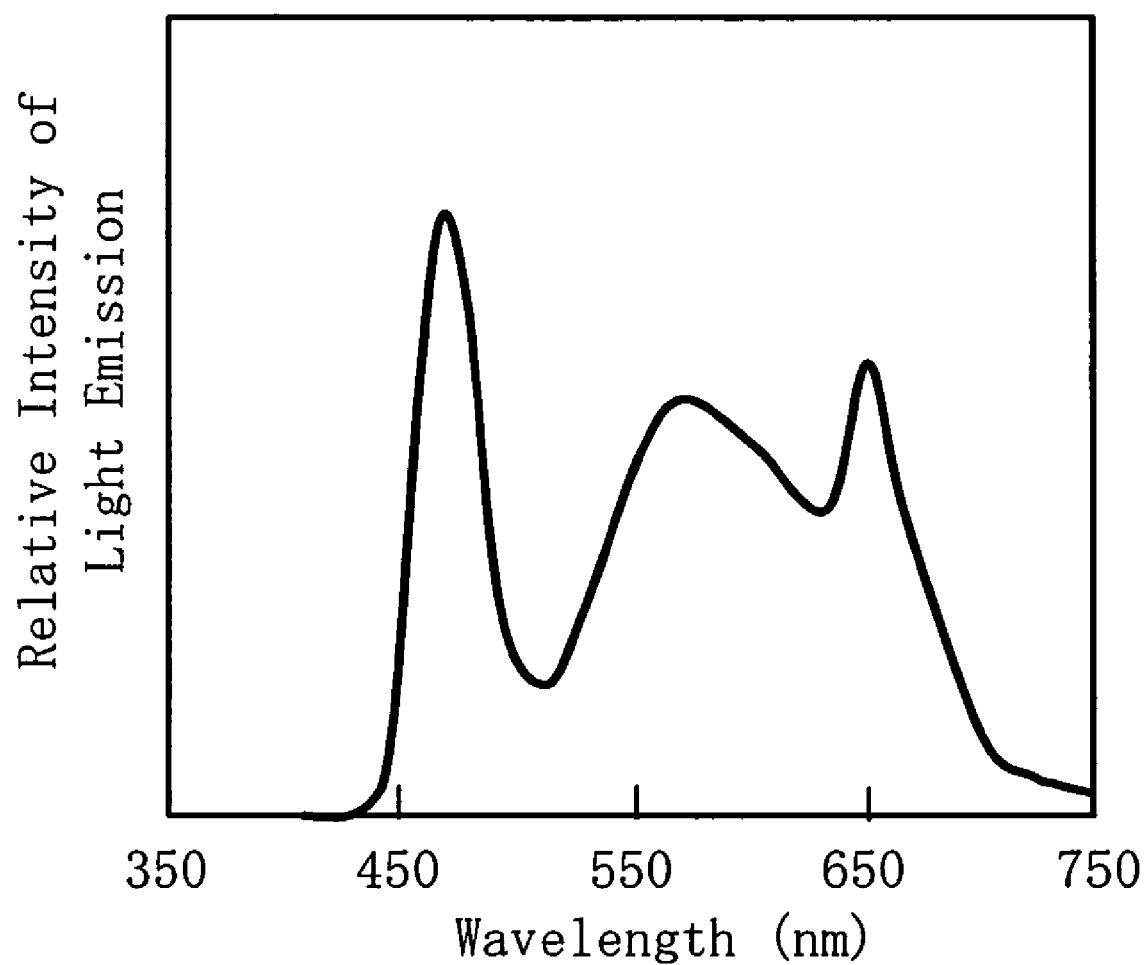
FIG. 16 is a spectrum chart of light emitted from the white light source 6 in the sixth embodiment.

Referring to FIGS. 14 through 16, a sixth embodiment of the present invention will be described herein below.

In the present embodiment, a description will be given to a structure of a white light source 6, a method for fabricating the white light source 6, and the mechanism of the emission of white light from the white light source 6. FIG. 14 is a schematic diagram of the white light source 6 in the present embodiment. FIGS. 15A through 15D are views illustrating the method for fabricating the white light source 6 in the present embodiment. FIG. 16 is a spectrum chart of light emitted from the white light source 6 in the present embodiment.

In the white light emitting element 60 in the present embodiment, an rare earth element is doped in the semiconductor layer 62. Wherein, the detailed description of the overlapping portion with the first embodiment is omitted.

First, the structure of the white light source 6 will be described.

Figure 14A:
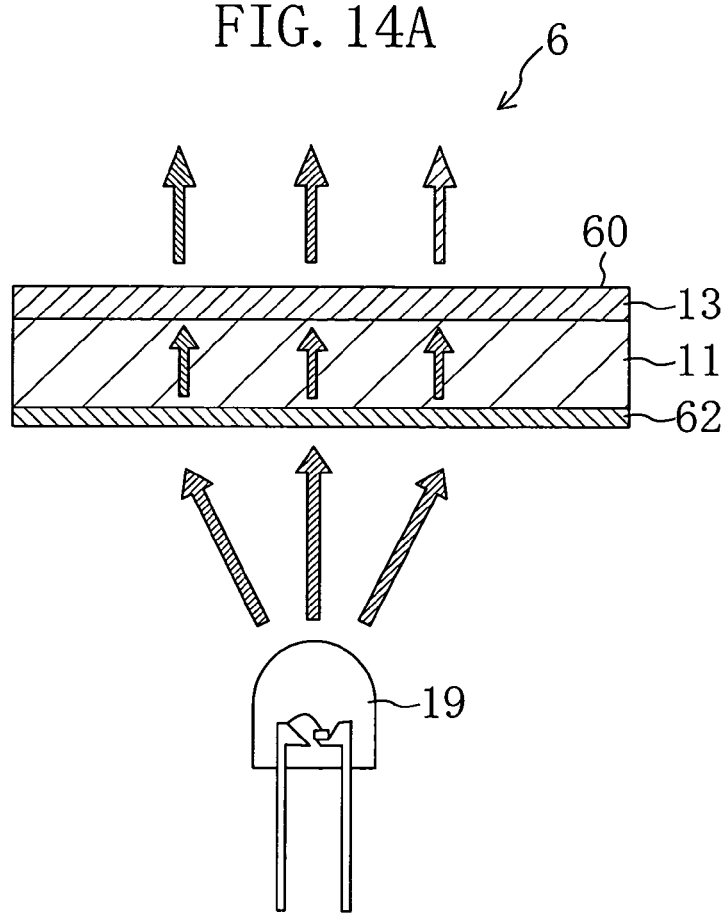
FIG. 14A is a schematic diagram showing a white light source 6 in a sixth embodiment of the present invention.

As shown in FIG. 14A, the white light source 6 comprises: an excitation light source 19; and a white light emitting element 60 provided at a position which allows the transmission of light emitted from the excitation light source 19. The white light emitting element 60 comprises: a sapphire substrate (substrate) 11 which transmits light emitted from the excitation light source 19; a semiconductor layer 62 epitaxially grown on a surface of the sapphire substrate 11; and a fluorescent layer 13 formed on the surface of the sapphire substrate 11 opposite to the surface thereof provided with the semiconductor layer 62.

The excitation light source 19 is a blue light emitting diode which emits blue light with a peak wavelength of 470 nm.

The semiconductor layer 62 is made of Eu doped $Al_{0.5}Ga_{0.5}N$ layer formed by doping $Eu^+$ to an undoped $Al_{0.5}Ga_{0.5}N$ layer 162. It is to be noted that the undoped $Al_{0.5}Ga_{0.5}N$ layer 162 may be a GaN layer or has a quantum well structure such as an $In_{0.02}Ga_{0.98}N/Al_{0.4}Ga_{0.6}N$ multi quantum well. Further, $Eu^+$ may be added at crystal growth of the undoped layer 162.

Figure 14B:
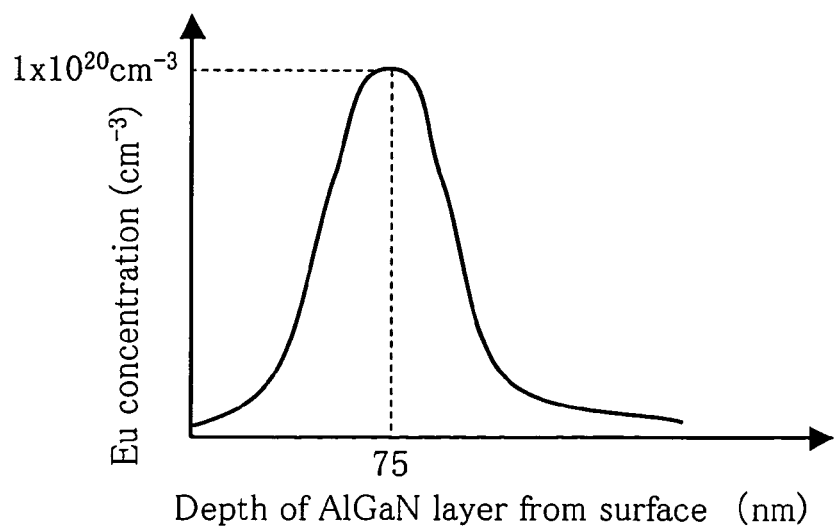
FIG. 14B is a graph showing a concentration distribution of $Eu^+$ in a semiconductor layer 62 of the white light source 6.

The dose amount of $Eu^+$ is preferably set in the range between $1\times10^{13}$ cm$^{-3}$ and $1\times10^{16}$ cm$^{-3}$, both inclusive, and more preferably set to $1\times10^{15}$ cm$^{-3}$. The acceleration voltage of $Eu^+$ is preferable set in the range between 100 keV and 500 keV, both inclusive, and more preferable set to 200 keV. As shown in FIG. 14B, the concentration distribution of the $Eu^+$ in the depth direction of the semiconductor layer 62 has a peak at the depth around 75 nm, and the concentration of the $Eu^+$ at the peak is approximately $1\times10^{20}$ cm$^{-3}$. Wherein, the concentration distribution of the $Eu^+$ varies depending on the dose amount and the acceleration voltage. Further, as shown in FIG. 15B, $Eu^+$ is added to only the surface portion of the semiconductor layer 62. Irradiation of visible light or ultraviolet light causes the inner shell electrons of the Eu to be excited. When the electrons return to the base level, the semiconductor layer 62 emits red light of 622 nm. The light intensity of the red light is increased by increasing the dose amount of $Eu^+$.

Next, a method for fabricating a white light source 6' with the white light emitting element 60 integrated therein will be described.

First, as shown in FIG. 15A, the undoped $Al_{0.5}Ga_{0.5}N$ layer 162 having a thickness of about 1 μm is formed on the surface of a sapphire substrate 11 by MOCVD.

20

Next, as shown in FIG. 15B, while the sapphire substrate 11 is heated by about 500° C., $Eu^+$ of $1\times10^{15}$ cm$^{-3}$ is implanted from the surface of the undoped $Al_{0.5}Ga_{0.5}N$ layer 162 at the acceleration voltage of 200 keV. Whereby, a layer 162a in which $Eu^+$ is doped is formed on the surface of the semiconductor layer 62, as shown in the enlarged view of FIG. 15B. The concentration distribution of $Eu^+$ after the implantation has a peak at the depth around 75 nm. Then, the sapphire substrate 11 is annealed at about 1000° C. in $N_2$ atmosphere after the ion implantation for ion activation of the $Eu^+$, so that the undoped $Al_{0.5}Ga_{0.5}N$ layer 162 is changed to the Eu doped $Al_{0.5}Ga_{0.5}N$ layer (semiconductor layer) 62.

Subsequently, as shown in FIG. 15C, a YAG fluorescent layer serving as the fluorescent layer 13 is formed on the surface of the sapphire substrate 11 opposite to the surface where the semiconductor layer 62 is formed. It is also possible to polish the sapphire substrate 11 and reduce the thickness thereof to, e.g., 100 μm or less before forming the YAG fluorescent layer 13. Whereby, the white light emitting element 60 shown in FIG. 14 is obtained.

Then, the white light emitting element 60 is diced into squares with, e.g., 1-mm sides. Thereafter, a blue light emitting diode chip 19' is provided on a package 16 and the white light emitting element 60 is adhered to the package 16 by using an adhesive agent 17 as shown in FIG. 15D, whereby the white light source 6' miniaturized for commercial use is fabricated.

The mechanism of the white light source 6 for emitting white light is as described in the first embodiment. Specifically, when the white light emitting element 60 is irradiated with the blue light emitted from the excitation light source 19, the white light emitting element 60 emits the white light composed of the red light emitted from the semiconductor layer 62 (peak wavelength of 622 nm), the yellow light emitted from the fluorescent layer 13 (peak wavelength of 550 nm), and the blue light emitted from the excitation light source 19 and passing through the white light emitting element 60 without being absorbed (peak wavelength of 470 nm), as shown in FIG. 16. Thus, the white light source 6 has more light components of the red light than that of the white light source 7 in the comparative embodiment and emits white light excellent in color rendering. As a result, a white light emitting diode excellent in color rendering is realized.

It is to be noted that $Eu^+$ is doped in the semiconductor layer 62 in the present embodiment, but $Sm^+$ or $Yb^+$ may be doped.

What is claimed is:

1. A light emitting element, comprising:
a light source;
a substrate which transmits irradiated light from the source, the substrate being located apart from the light source and made of a single crystal;
a semiconductor layer epitaxially grown on a surface of the substrate; and
a fluorescent layer formed on a surface of the substrate opposite to the surface thereof provided with the semicondutor layer or on a surface of the semiconductor layer, wherein
the fluorescent layer emits yellow light or green light through irradiation by the light source, and
the semiconductor layer emits red light through irradiation by the light source;
the semicondutor layer and the fluorescent are respectively located apart from the light source, and the light emitted from the light source is incident on the surface of the substrate provided with the semiconductor layer or the surface of the substrate opposite to the surface.

2. The light emitting element of claim 1, wherein the fluorescent layer for emitting the yellow light or the green light contains a YAG fluorescent material.

3. The light emitting element of claim 1, which emits light composed of the red light, the yellow light or the green light through irradiation with the irradiation light.

4. The light emitting element of claim 1, wherein
the semiconductor layer contains impurities and
the semiconductor layer emits light in a visible region through recombination between an electron and a hole via an energy level resulting from the impurities through irradiation with the irradiated light.

5. The light emitting element of claim 4, wherein the semiconductor layer contains any one or two or all of Si, Mg, and Zn, each as an impurity.

6. The light emitting element of claim 1, wherein
the semiconductor layer contains impurities; and
the semiconductor layer emits light in a visible region via transition between energy levels at inner shell of the one more impurities through irradiation with the irradiated light.

7. The light emitting element of claim 6, wherein the semiconductor layer contains any one or two or all of Eu, Sm and Yb, each as the one or more impurities.

8. The light emitting element of claim 6, wherein the one or more impurities is introduced to the semiconductor layer by ion implantation.

9. The light emitting element of claim 1, wherein the semiconductor layer is made of $Al_xGa_yIn_{(1-x-y)}N$ ($0 \leq x \leq 1$, $0 \leq y \leq 1$, $0 \leq 1-x-y \leq 1$).

10. The light emitting element of claim 1, wherein the substrate is made of sapphire.

11. A white light source comprising:
an excitation light source; and
a light emitting element for generating white light through irradiation with light from the excitation light source, wherein
the light emitting element comprises:
a substrate which transmits the light from the excitation light source and is located apart from the excitation light source and is made of a single crystal;
a semiconductor layer epitaxially grown on a surface of the substrate; and
a fluorescent layer formed on a surface of the substrate opposite to the surface thereof provided with the semiconductor layer or on a surface of the semiconductor layer,
the fluorescent layer emits yellow light or green light through irradiation by the excitation light source,
the semiconductor layer emits red light through irradiation by the excitation light source,
the semiconductor layer and the fluorescent layer are respectively located apart from the excitation light source, and
the light emitted from the excitation light source is incident on the surface of the substrate provided with the semiconductor layer or the surface of the substrate opposite to the surface.

12. The white light source of claim 11, wherein the fluorescent layer for emitting the yellow light or the green light contains a YAG fluorescent material.

13. The white light source of claim 11, which emits white light composed of the red light, the yellow light or the green light through irradiation by the excitation light source.

14. The white light source of claim 11, wherein
the semiconductor layer contains one or more impurities; and
the semiconductor layer emits light in a visible region through recombination between an electron and a hole via an energy level resulting from the one or more impurities through irradiation by the excitation light source.

15. The white light source of claim 14, wherein the semiconductor layer contains any one or two or all of Si, Mg, and Zn, each as the one or more impurities.

16. The white light source of claim 11, wherein
the semiconductor layer contains one or more impurities; and
the semiconductor layer emits light in a visible region via inner shell transition of the one or more impurities through irradiation by the excitation light source.

17. The white light source of claim 16, wherein the semiconductor layer contains any one or two or all of Eu, Sm and Yb, each as the one or more impurities.

18. The white light source of claim 16, wherein the one or more impurities is introduced to the semiconductor layer by ion implantation.

19. The white light source of claim 11, wherein the semiconductor layer is made of $Al_xGa_yIn_{(1-x-y)}N$ ($0 \leq x \leq 1$, $0 \leq y \leq 1$, $0 \leq 1-x-y \leq 1$).

20. The white light source of claim 11, wherein the substrate is made of sapphire.

21. The white light source of claim 11, wherein the excitation light source comprises a GaN-based light emitting diode and the excitation light source is in a package with the light emitting element.

* * * * *